United States Patent
Oh

(10) Patent No.: US 7,977,176 B2
(45) Date of Patent: Jul. 12, 2011

(54) FLEXIBLE DISPLAY DEVICE AND FABRICATING METHOD THEREOF

(75) Inventor: Eui Yool Oh, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 622 days.

(21) Appl. No.: 12/003,162

(22) Filed: Dec. 20, 2007

(65) Prior Publication Data

US 2008/0179594 A1     Jul. 31, 2008

(30) Foreign Application Priority Data

Jan. 26, 2007 (KR) .................. 10-2007-0008397

(51) Int. Cl.
    *H01L 21/00*     (2006.01)
(52) U.S. Cl. ................... 438/160; 257/E21.414
(58) Field of Classification Search .............. 438/160; 257/E21.414
See application file for complete search history.

(56) References Cited

U.S. PATENT DOCUMENTS

| 5,339,180 | A | * | 8/1994 | Katoh | 349/46 |
| 6,700,631 | B1 | * | 3/2004 | Inoue et al. | 349/45 |
| 7,271,415 | B2 | * | 9/2007 | Takechi | 257/72 |
| 2004/0142118 | A1 | * | 7/2004 | Takechi | 428/1.6 |
| 2005/0167666 | A1 | * | 8/2005 | Onozuka et al. | 257/66 |
| 2006/0113903 | A1 | * | 6/2006 | Kim | 313/506 |

* cited by examiner

*Primary Examiner* — Charles D Garber
*Assistant Examiner* — Stanetta D Isaac
(74) *Attorney, Agent, or Firm* — Morgan, Lewis & Bockius LLP

(57) ABSTRACT

A flexible display device for improving reliability, and a fabricating method thereof are disclosed. In the method of fabricating the flexible display device, an insulating protective layer is formed at one side of a glass substrate. A display device including a thin film transistor array and a pad part, which is connected to the thin film transistor array, is formed on the insulating protective layer. A flexible substrate is attached on the display device. And the glass substrate is removed.

11 Claims, 27 Drawing Sheets

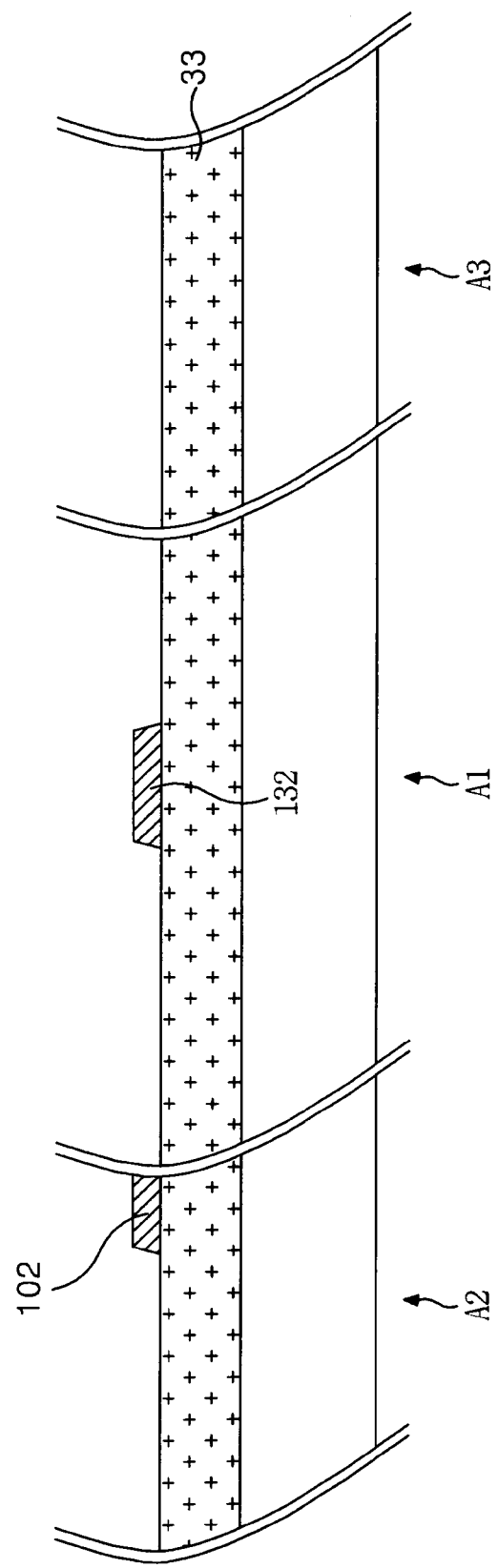

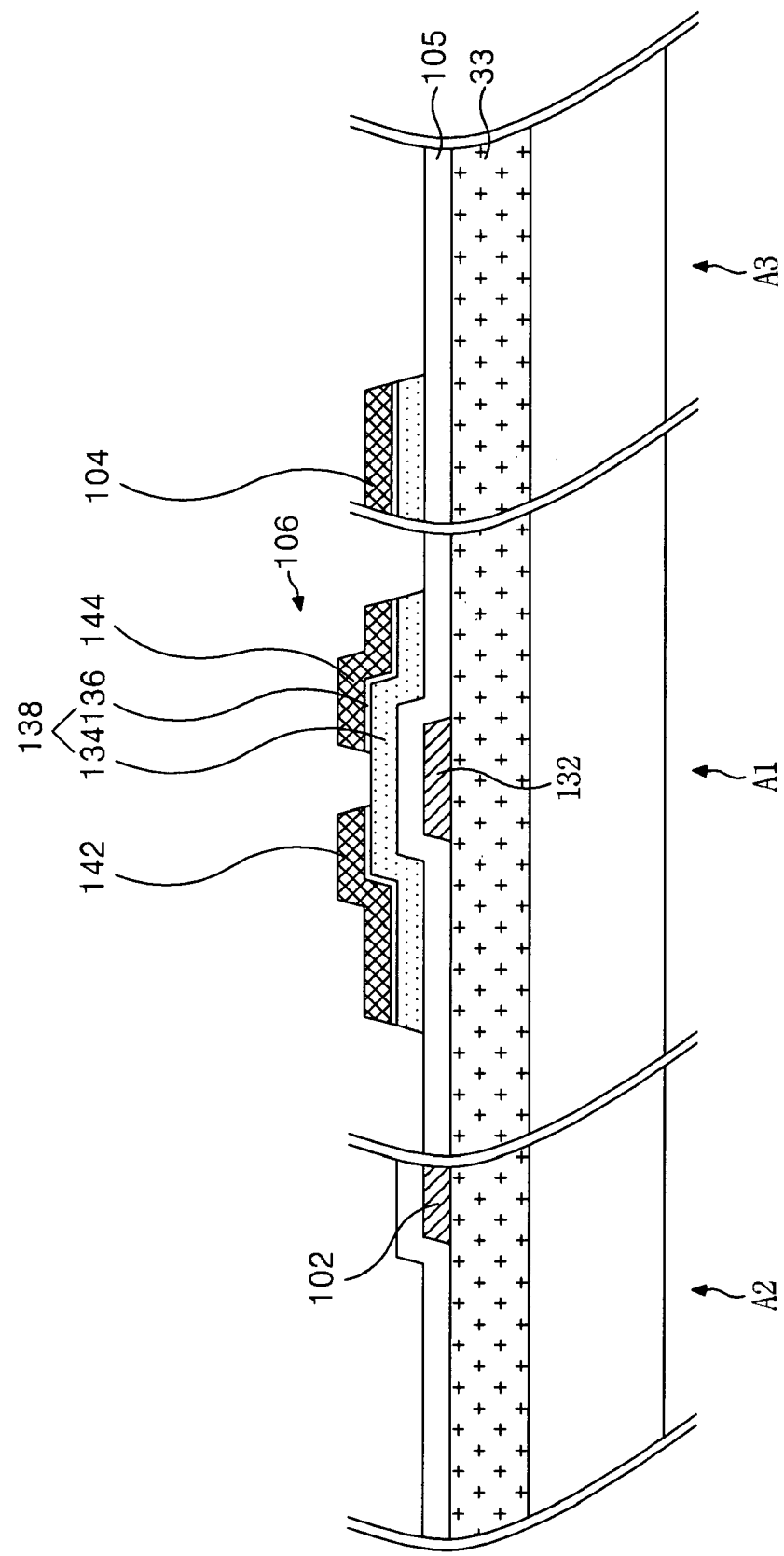

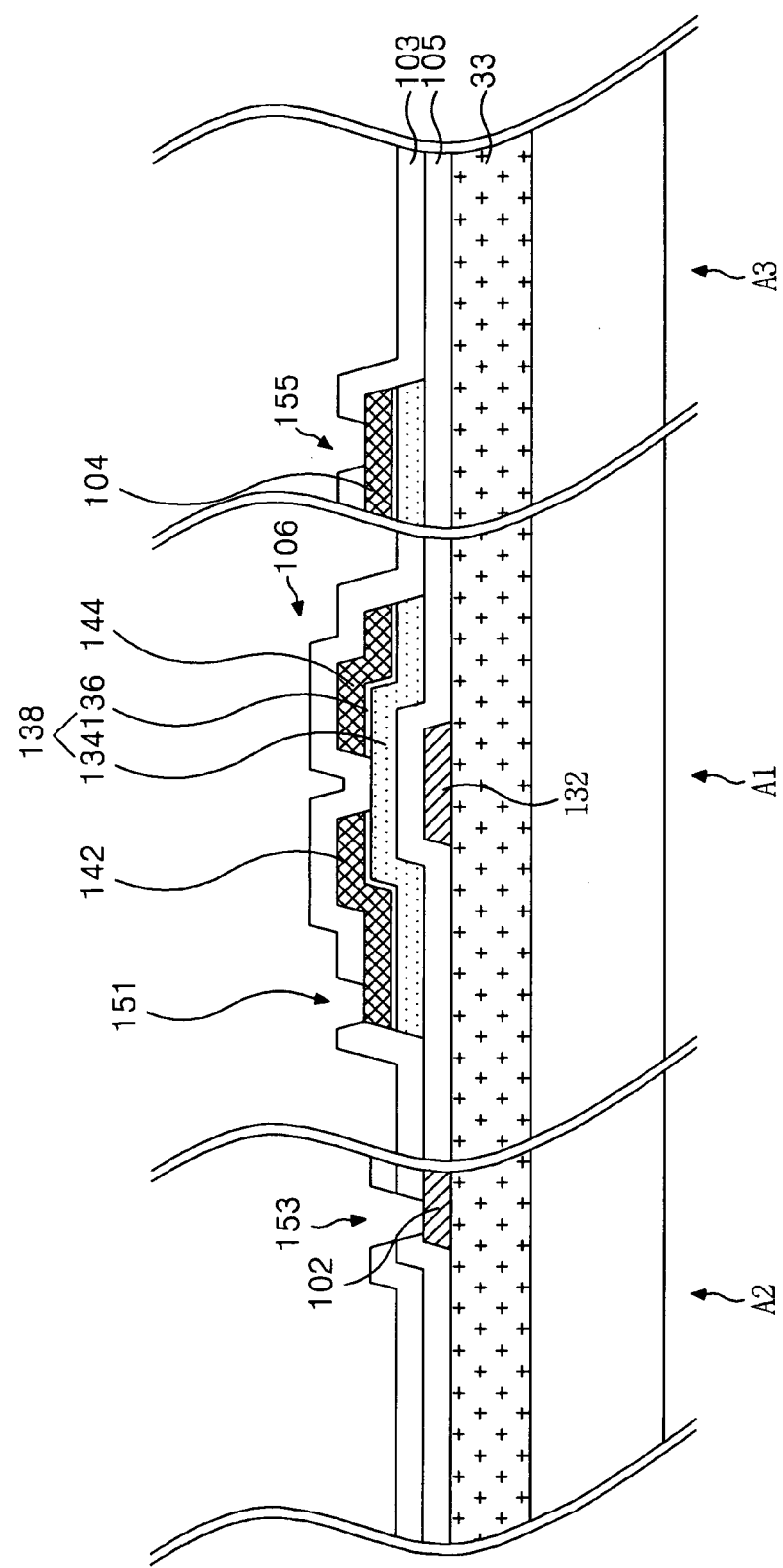

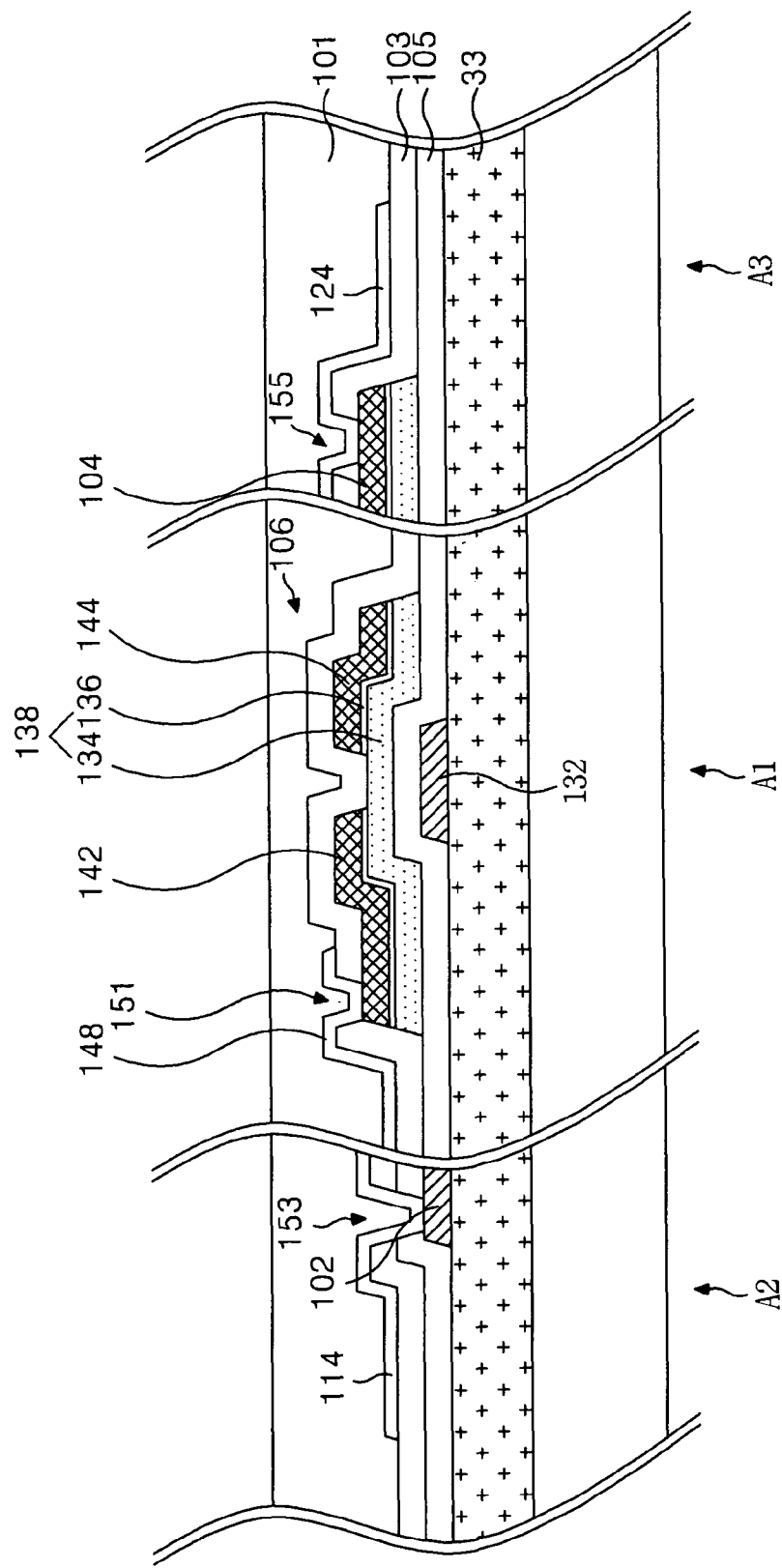

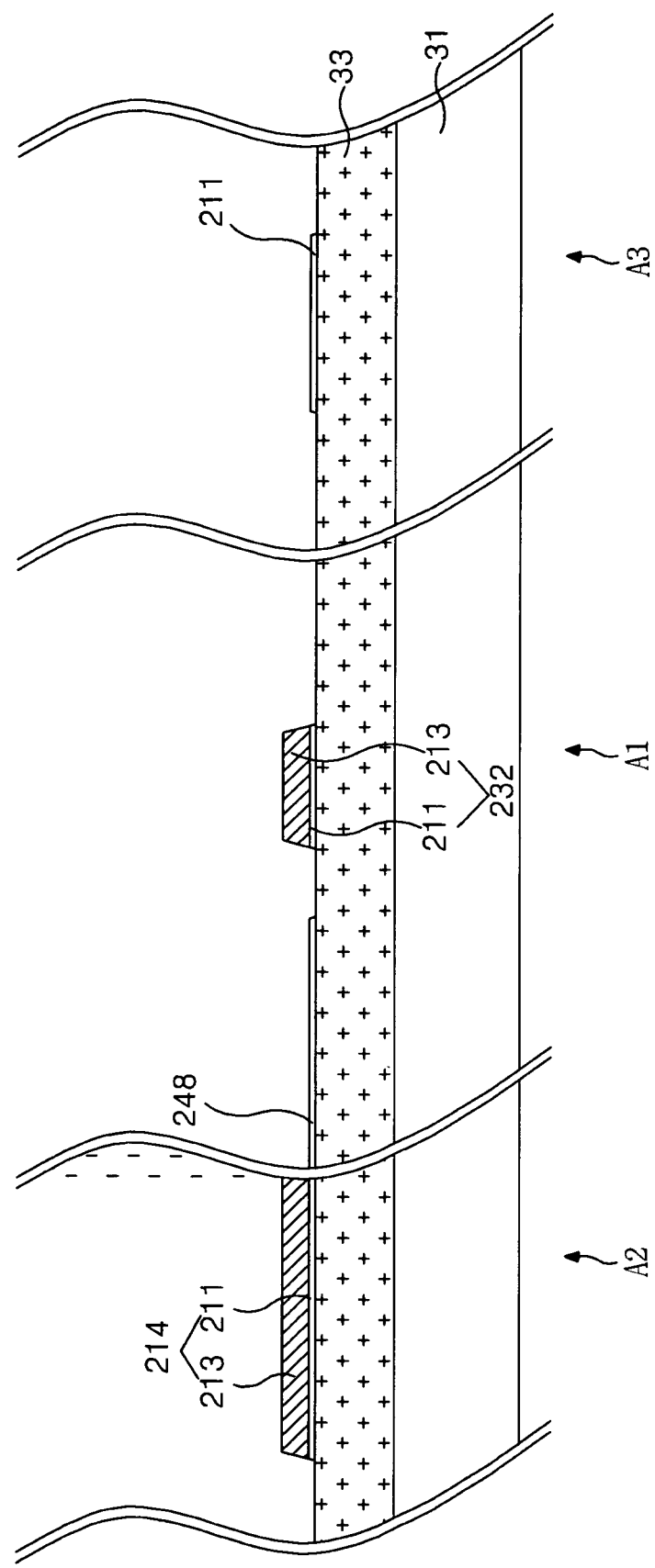

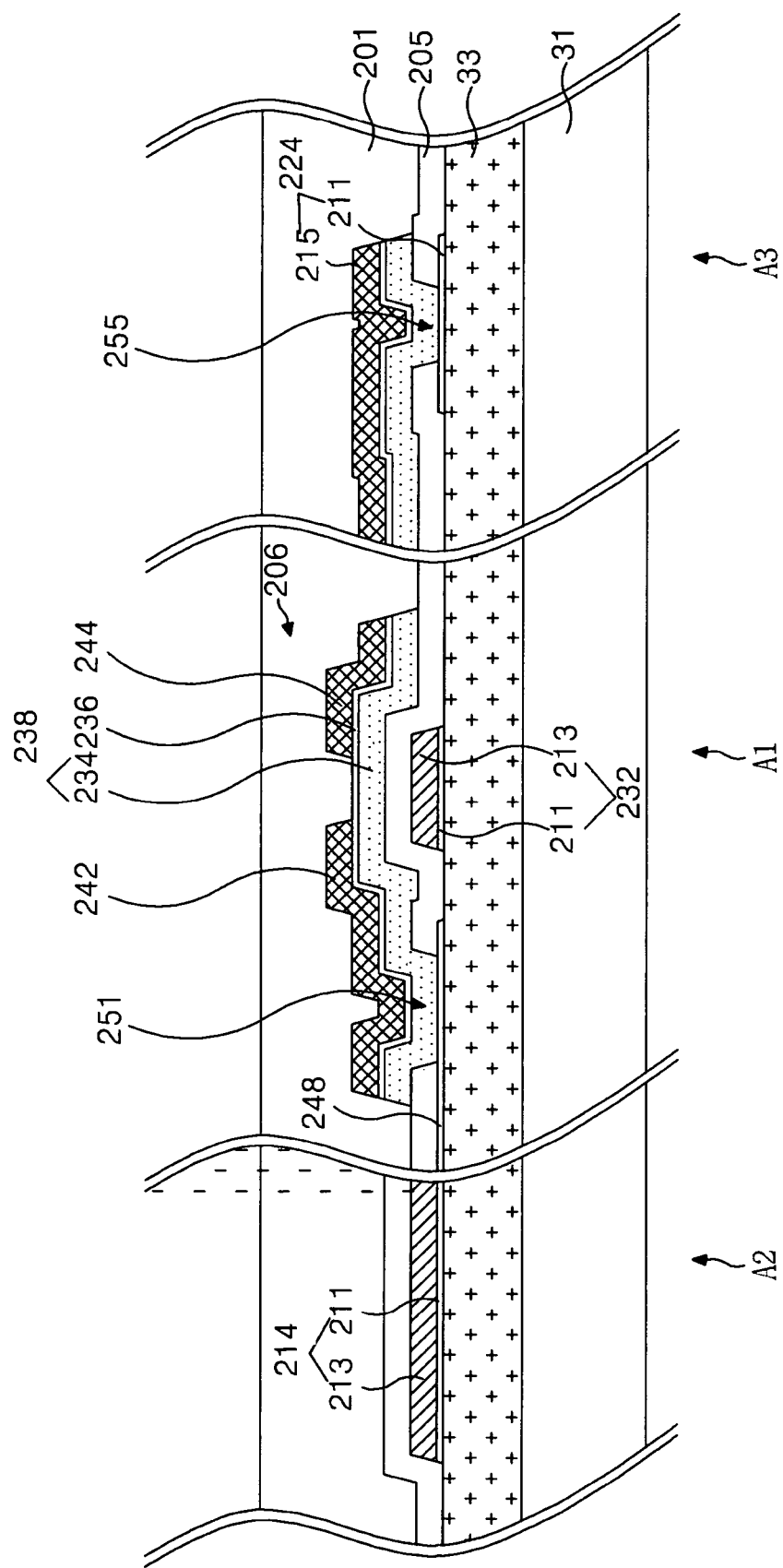

FLEXIBLE DISPLAY DEVICE AND FABRICATING METHOD THEREOF

This application claims the benefit of Korean Patent Application No. P2007-08397 filed in Korea on Jan. 26, 2007, which are hereby incorporated by reference.

BACKGROUND OF THE INVENTION

1. Field of the Invention

The present invention relates to a flexible display device and a fabricating method thereof, and more particularly to a flexible display device that is adaptive for improving reliability, and a fabricating method thereof.

2. Description of the Related Art

In the display device market, the flat panel display (hereinafter, referred to as "FPD") has been remarkably grown up with replacing the CRT (or Cathode Ray Tube) monitor. There are many kinds of devices for the FPD, for example, the liquid crystal display (LCD), the plasma display panel (PDP) or the organic electro luminescence display (OLED). The FPD has lighter weight and thinner thickness than CRT. Therefore it is proper to apply to the large size display system or the portable display system. Because the main elements of the FPD is formed by high temperature processes, most FPD uses glass substrates to endure against the high temperature required in the fabricating processes. However, as the glass substrate has the rigid properties, the glass substrate has limitation to be freely applied to the flexible display device. Recently, flexible materials are used for the FPD to develop the flexible display device which has merit such that it can be rolled or folded so that you can freely handle it in any conditions. That is, using a flexible material such as plastic film or metal foil, the flexible displays which have the same displaying performance even it is rolled or bent like a paper are interested in the display industries.

A flexible substrate has the heat resistance inferior to that of the glass substrate. Therefore, these flexible substrates can be easily deformed by the high temperature applied during the processing steps for fabricating the display device. The deformed substrate can not guarantee the quality of the display elements formed thereon. That is, it is impossible to form the display device on the flexible substrate directly. Recently, in order to overcome the above-mentioned problem, the substrate transcription method that forms the display device on a glass substrate, attaches a plastic substrate on the display device, and then removes the glass substrate to complete a flexible display, has been suggested.

FIG. 1A to FIG. 1F are diagrams showing the related art method of fabricating flexible display using the substrate transcription method. Herein, the related art method of fabricating flexible display using the substrate transcription method includes forming an insulating protective layer 3 on a glass substrate 1, forming a display device 5, attaching a temporary substrate 7, removing the glass substrate 1 and the insulating protective layer 3, attaching a flexible substrate 9, and removing the temporary substrate 7.

As shown in FIG. 1A, in the step of forming the insulating protective layer 3, the insulating protective layer 3 is disposed on the glass substrate 1 with a thickness predetermined to have enough thermal resistance against the heat of fabricating process.

As shown in FIG. 1B, in the step of forming the display device 5, a variety of lines configuring the display device such as a thin film transistor array and the like are formed on the insulating protective layer 3. The step of forming the display device 5 includes a plurality of photolithography processes and etching processes.

As shown in FIG. 1C, in the step of attaching the temporary substrate 7, the temporary substrate 7 is attached on the display device 5 using adhesive. The temporary substrate 7 plays a role to temporarily support the display device 5 after removing the glass substrate 1 and the insulating protective layer 3 in the following process.

As shown in FIG. 1D, in the step of removing the glass substrate 1 and the insulating protective layer 3, the glass substrate 1 and the insulating protective layer 3 are removed using an etchant including the hydrogen fluoride (HF).

As shown in FIG. 1E, in the step of attaching the flexible substrate 9, the flexible substrate 9 is attached at a rear side of the display device where the glass substrate 1 and the insulating protective layer 3 are removed, using adhesive. As a result, the flexible substrate 9 will be the actual substrate of the display to support the display device 5 and to give the flexibility to the flexible display.

As shown in FIG. 1F, in the step of removing the temporary substrate 7, the temporary substrate 7 is stripped to complete a final substrate having the display device 5 which is remained on the flexible substrate 9.

In this way, since the method of fabricating the flexible display using the substrate transcription method attaches the temporary substrate 7 on the display device 5, and then removes the glass substrate 1 and the insulating protective layer 3, the display device 5 can be supported by the temporary substrate 7. Furthermore, the glass substrate 1 and the insulating protective layer 3 are removed, and then the flexible substrate 9 is attached at the rear side of the exposed display device 5, and the temporary substrate 7 attached on the display device 5 is stripped. Thus, the flexible display using the related art substrate transcription method may have the same structure except for a support substrate in comparison with the related art display. Accordingly, a structure of pad part which supplies a signal to the thin film transistor array, is also equal to that of the related art display. Herein, the pad part may connect the thin film transistor array of the flexible display. However, the method of fabricating the flexible display using the related art substrate transcription method includes a process of stripping the temporary substrate 7 on the display device 5. Thus, there is a problem in that the display device 5 can be damaged during the process of stripping the temporary substrate 7.

SUMMARY OF THE INVENTION

Accordingly, it is an object of the present invention to provide a flexible display device that is adaptive for improving reliability, and a fabricating method thereof.

In order to achieve these and other objects of the invention, a method of fabricating a flexible display according to the present invention comprises forming an insulating protective layer at one side of a glass substrate; forming a display device including a thin film transistor array and a pad part, which is connected to the thin film transistor array, on the insulating protective layer; attaching a flexible substrate on the display device; and removing the glass substrate.

In the method, a method of forming the display device includes forming a gate conductive pattern including a gate line, which is formed of a gate conductive layer, and a gate electrode, which is extended from the gate line, on the insulating protective layer; forming a gate insulating film to cover the gate conductive pattern; forming a semiconductor pattern, which is overlapped with the gate electrode, and a source/ drain conductive pattern including a source electrode and a drain electrode, which are disposed on the semiconductor pattern, and a data line, which is extended from the source electrode and crosses the gate line; forming a protective film to cover the semiconductor pattern and the source/drain conductive pattern; forming a gate contact hole that passes through the protective film and the gate insulating film to expose the gate line, and a data contact hole that passes through the protective film to expose the data line; and forming a transparent oxidized conductive layer of a gate pad electrode, which is connected, via the gate contact hole, to the gate line, and a transparent oxidized conductive layer of a data pad electrode, which is connected, via the data contact hole, to the data line.

The method of fabricating the flexible display device includes forming a photo-resist pattern at an external surface of the insulating protective layer after removing the glass substrate; and etching the insulating protective layer, the gate insulating film, and the protective film using the photo-resist pattern to form a pad hole that exposes a transparent oxidized conductive layer of the pad electrode.

In the method, the step of forming the display device includes forming a transparent conductive pattern including a transparent oxidized conductive layer, that is, a data pad electrode, a gate pad electrode, a gate line, which is extended from the gate pad electrode, and a gate electrode, which is extended from the gate line, on the insulating protective layer, and a gate conductive pattern which is disposed on a transparent oxidized conductive layer of the gate pad electrode, the gate line, and the gate electrode; forming a gate insulating film to cover the transparent conductive pattern and the gate conductive pattern; forming a data contact hole that exposes a transparent oxidized conductive layer of the data pad electrode; and forming a source/drain conductive pattern including a semiconductor pattern, which is overlapped with the gate electrode, a source electrode and a drain electrode, which are disposed on the semiconductor pattern, a data line, which is extended from the source electrode and crosses the gate line, and a source/drain metal layer of a data pad electrode which is extended from the data line to be connected, via the data contact hole, to a transparent oxidized conductive layer of the data pad electrode.

The method of fabricating the flexible display device includes forming a photo-resist pattern at an external surface of the insulating protective layer after removing the glass substrate; and etching the insulating protective layer using the photo-resist pattern to form a pad hole that exposes a transparent oxidized conductive layer of the pad electrode.

The method of fabricating the flexible display device includes entirely etching the insulating protective layer to expose the transparent conductive pattern after removing the glass substrate.

The method of fabricating the flexible display device includes exposing a pad electrode, which is included in the pad part, after removing the glass substrate.

In the method, a pad electrode, which is included in the pad part, is formed in a single layer structure or in a multiple layered structure that includes a transparent oxidized conductive layer.

In the method, a transparent oxidized conductive layer of the pad electrode is most adjacent to the insulating protective layer in the pad part.

In the method, a pad electrode, which is exposed in the step of exposing a pad electrode included in the pad part, is the transparent oxidized conductive layer.

In the method, the transparent oxidized conductive layer includes any one among TO (Tin Oxide), ITO (Indium Tin Oxide), ITZO (Indium Tin Zinc Oxide), and IZO (Indium Zinc Oxide).

In the method, the step of forming the display device includes forming a smoothing layer that levels a surface where the display device is formed.

A flexible display device comprises a flexible substrate; a protective film formed on a flexible substrate; a source/drain conductive layer that is formed on the protective film, and includes a data line, a source electrode extended from the data line, and a drain electrode facing the source electrode; a semiconductor pattern that is overlapped with the source electrode and the drain electrode, and forms a channel between the source electrode and the drain electrode; a gate insulating film that covers the source/drain conductive layer and the semiconductor pattern; a gate conductive layer that is formed on the gate insulating film, and includes a gate line crossing the data line, and a gate electrode extended from the gate line to be overlapped with the semiconductor pattern; a gate pad electrode of a transparent oxidized conductive layer that is extended toward the gate line direction between the flexible substrate and the protective film, and is connected, via a gate contact hole that passes through the gate insulating film and the protective film to expose the gate line, to the gate line; a data pad electrode of a transparent oxidized conductive layer that is extended toward the data line direction between the flexible substrate and the protective film, and is connected, via a data contact hole that passes through the protective film to expose the data line, to the data line; an insulating protective layer that is formed to cover the gate conductive layer on the gate insulating film; and a pad hole that passes through the insulating protective layer, the gate insulating film, and the protective film to expose the pad electrodes.

A flexible display device comprises a flexible substrate; a source/drain conductive layer that includes a data line formed on a flexible substrate, a source electrode and a data pad electrode, which are extended from the data line, and a drain electrode facing the source electrode; a semiconductor pattern that is overlapped with the source electrode and the drain electrode, and forms a channel between the source electrode and the drain electrode; a gate insulating film that covers the source/drain conductive pattern and the semiconductor pattern; a gate conductive layer that is formed on the gate insulating film, and includes a gate line crossing the data line, a gate electrode extended from the gate line to be overlapped with the semiconductor pattern, and a gate pad electrode extended from the gate line; a transparent conductive layer which is disposed in the same pattern on the gate conductive layer; a data contact hole that passes through the gate insulating film overlapped with the data pad electrode of the source/drain conductive layer; and a data pad electrode of a transparent conductive layer that is connected, via the data contact hole, to a data pad electrode of the source/drain layer.

The flexible display device further includes an insulating protective layer that has a pad hole exposing a gate pad electrode of the transparent conductive layer and a data pad electrode of a transparent conductive layer on the gate insulating film.

In the flexible display device, the transparent oxidized conductive layer includes any one among TO (Tin Oxide), ITO (Indium Tin Oxide), ITZO (Indium Tin Zinc Oxide), and IZO (Indium Zinc Oxide).

In the flexible display device, a smoothing layer, which levels a surface where the conductive layers are formed, is further formed at a bordering surface of the flexible substrate and the conductive layers.

BRIEF DESCRIPTION OF THE DRAWINGS

These and other objects of the invention will be apparent from the following detailed description of the embodiments of the present invention with reference to the accompanying drawings, in which:

FIG. 6A to FIG. 6D are sectional views for explaining a step of forming a display device of the method of fabricating the flexible display device shown in FIG. 5A and FIG. 5B, step by step;

FIG. 9A to FIG. 9C are sectional views for explaining a step of forming a display device of the method of fabricating the flexible display device shown in FIG. 7A and FIG. 8B, step by step.

DETAILED DESCRIPTION OF THE PREFERRED EMBODIMENT

With reference to FIG. 2 to FIG. 9C, embodiments of the present invention will be explained as follows.

Figure 1A:
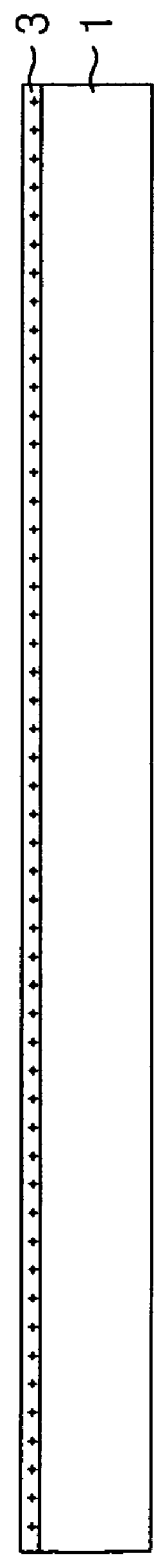
FIG. 1A to FIG. 1F are diagrams showing a method of fabricating the related art flexible display device using a substrate transcription method, step by step.
Figure 1B:
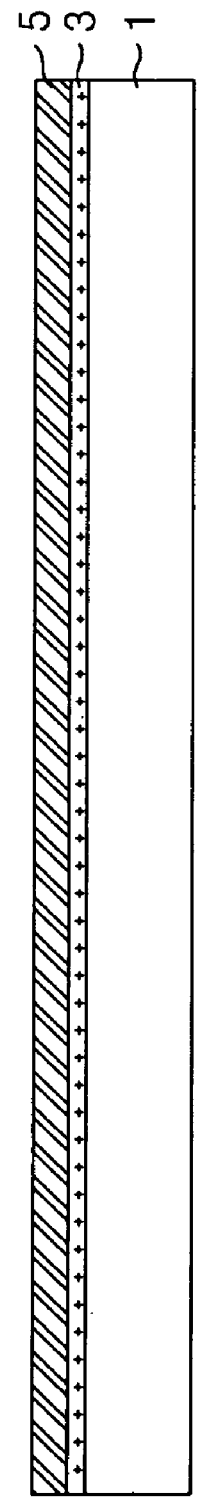
Figure 1C:
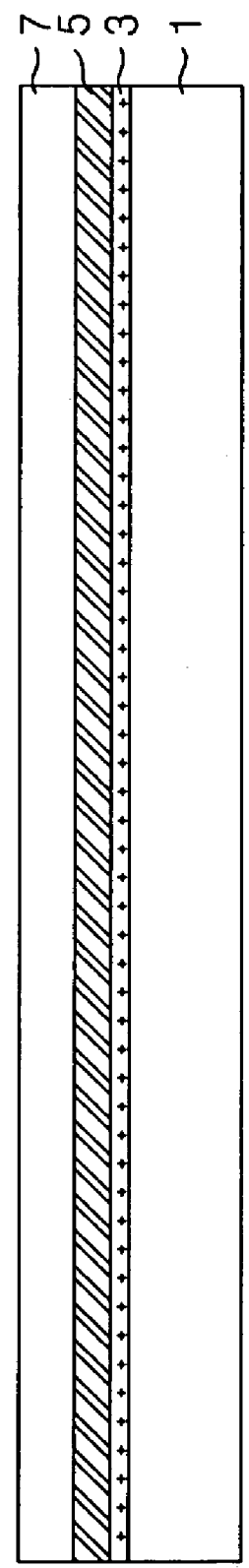
Figure 1D:
Figure 1E:
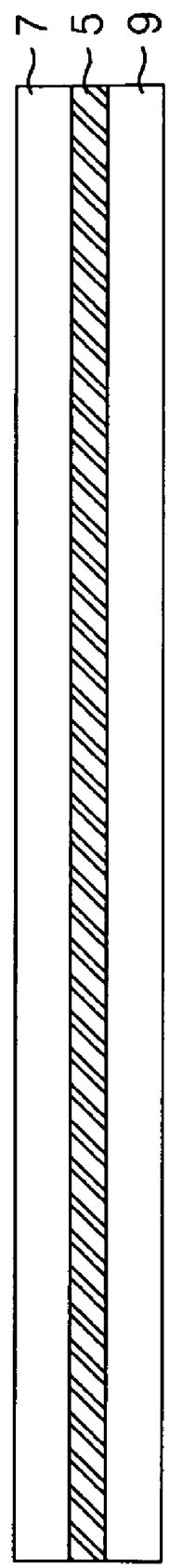
Figure 1F:
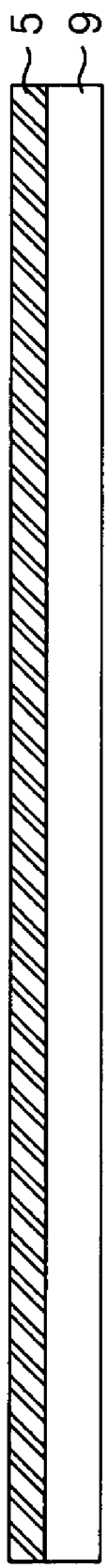
Figure 2:
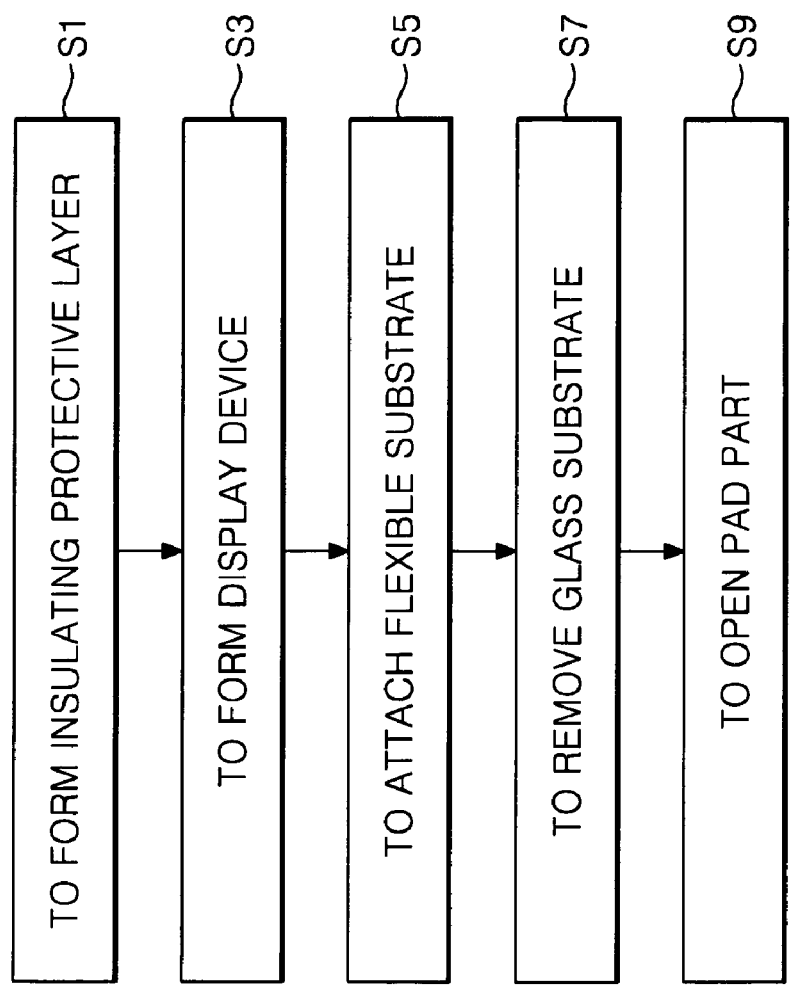
FIG. 2 is a flow chart showing a method of fabricating a flexible display device according to the present invention, step by step.
Figure 3A:
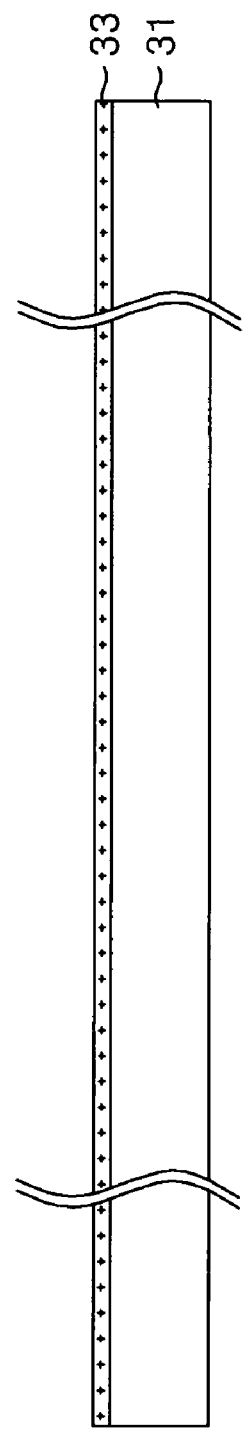
FIG. 3A to FIG. 4 are sectional views for explaining the method of fabricating the flexible display device shown in FIG. 2.

FIG. 2 is a flow chart showing a method of fabricating a flexible display device according to the present invention, step by step. FIG. 3A to FIG. 4 are sectional views for explaining the method of fabricating the flexible display device shown in FIG. 2, step by step. Referring to FIG. 2 to FIG. 4, the method of fabricating the flexible display device according to the present invention includes a step of forming an insulating protective layer 33 (S1), a step of forming a display device 35 (S3), a step of attaching a flexible substrate 37 (S5), a step of removing a glass substrate 31 (S7), and a step of opening a pad part (S9).

As shown in FIG. 3A, in the step of forming the insulating protective layer 33, the insulating protective layer 33 is formed at one side of the glass substrate having a strong heat resistance and an excellent flexibility. Such an insulating protective layer 33 is formed in a single layer structure such as the silicon oxide SiOx, the silicon nitride SiNx, the silicon film, or the metal oxide and the like. Also, the insulating protective layer 33 may be formed in a double layered structure that further includes the silicon oxide SiOx or the silicon nitride SiNx having more excellent insulation characteristics than that of the silicon film or the metal oxide in order to improve insulation characteristics of the silicon film or the metal oxide. In other words, the insulating protective layer 33 may be formed in a double layered structure of the silicon film and the silicon nitride, the silicon film and the silicon oxide, the metal oxide and the silicon nitride, or the metal oxide and the silicon oxide. Furthermore, the insulating protective layer 33 may be made of an organic insulating material such as an acrylic organic compound, BCB (Benzocyclobutene), and PFCB (Perfluorocyclobutane) and the like. The insulating protective layer 33 is not removed in the step of removing the glass substrate (S7), and plays a role to protect the display device. To this end, when an etching selectivity on a glass is less than 1/20, the insulating protective layer 33 is not almost removed by an etching solution and an etching gas in the step of removing the glass substrate (S7). In this way, if the insulating protective layer 33 is almost not removed, the display device is protected in the step of removing the glass substrate (S7). In other words, the insulating protective layer 33, which has an etching ratio of glass:insulating protective layer of more than 20:1, for example, 30:1, 40:1 and the like on the etching solution or the etching gas, is not almost removed in the step of removing the glass substrate (S7). As a result, the display device is protected from the etching process. Since an etching selectivity of the silicon film or the metal oxide on the glass is less than 1/20, the insulating protective layer 33 including the silicon film or the metal oxide protects the display device from the etching process more stably. Herein, the metal oxide includes CrxOy, TaxOy, and AlxOy and the like. A metal is disposed, and then the metal oxide is formed by oxidizing the disposed metal using the anodizing method.

Figure 3B:
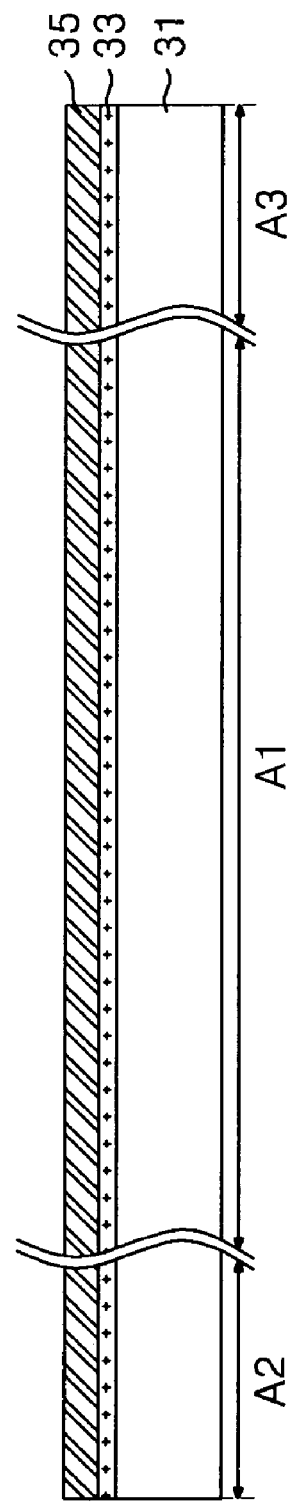
Figure 4:
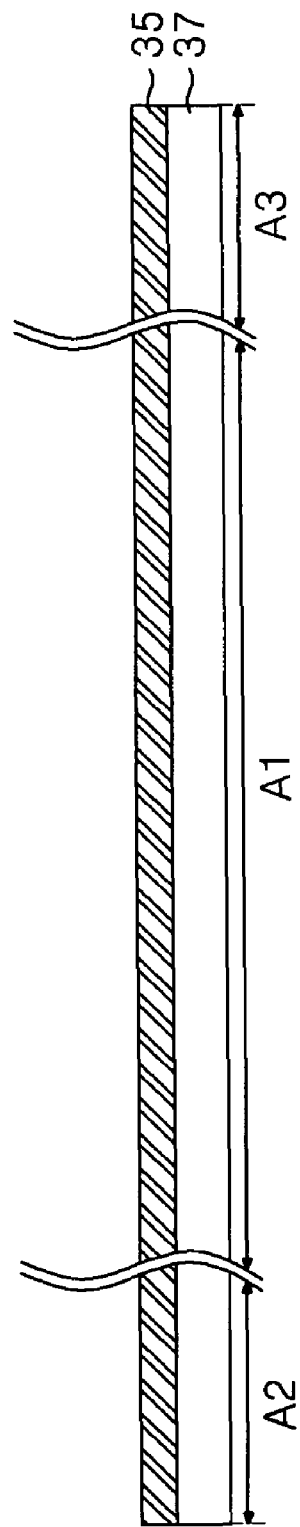

As shown in FIG. 3B, in the step of forming the display device 35, the display device that includes thin film patterns realizing a pixel, is formed on the insulating protective layer 33. An area of such a display device 35 is divided into a pixel array area A1 and pad areas A2 and A3.

A thin film transistor array and a pixel electrode, which is connected to the thin film transistor array, or an electroluminescence device are formed at the pixel array area A1. Such a pixel array area A1 is a display area where an image is displayed.

Electrodes, which are connected to the thin film transistor to supply a driving signal to the thin film transistor, are formed at the pad areas A2 and A3. Such pad areas A2 and A3 are formed at an edge of the display device, and supply a signal, which realizes an image, to the thin film transistor array. Also, the pad areas A2 and A3 are non-display areas.

As described above, since a plurality of thin film patterns are overlapped with each other, a surface of the display device 35 is not leveled but rough. Accordingly, when the step of attaching the flexible substrate (S5) is carried out, the flexible substrate should be attached on the rough surface of the display device 35. In this case, a pressure for attaching the flexible substrate is not uniformly pressurized on an entire surface of the display device 35. Thus, there is a problem in that a leakage current is generated by shorting a line where a pressure is highly pressurized, or a film of a part where a pressure is highly pressurized can be damaged by a stress to deteriorate a characteristics of the display device 35. Accordingly, the step of forming the display device S3 according to the present invention can further include forming a smoothing layer to cover the pixel array area A1 and the pad areas A2 and A3. The smoothing layer plays a role in leveling a surface where the display device 35 is formed, and in dispersing a pressure, which is pressurized during an attaching process. Also, the smoothing layer plays a role in protecting the thin film transistor. A surface where the display device 35 is formed is coated with at least any one of a resin, a liquid SiNx material, or a liquid SiOx material before attaching the flexible substrate, and then is cured with a specific temperature to complete such a smoothing layer.

Figure 3C:
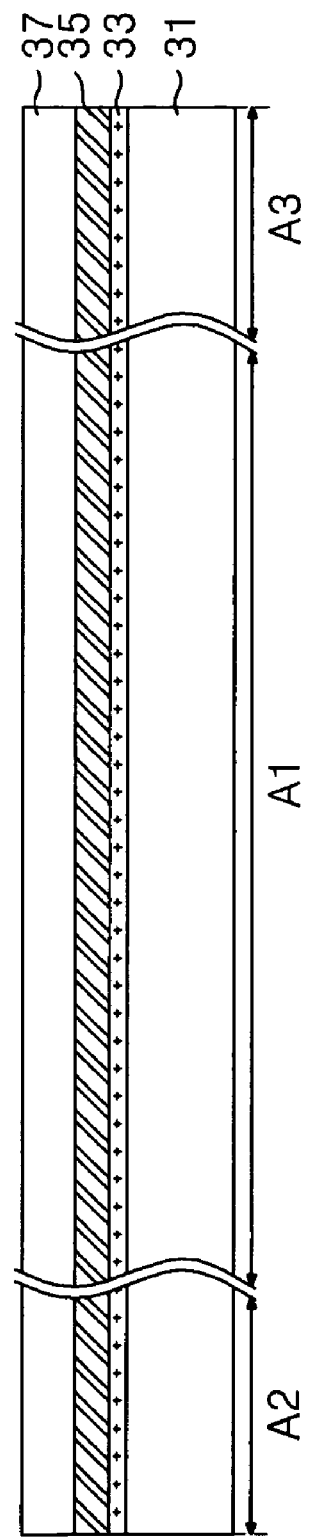

As shown in FIG. 3C, in the step of attaching the flexible substrate 37, the flexible substrate 37 is attached on the display device 35. After removing the glass substrate 31, the flexible substrate 37 supports the display device 35 instead of the glass substrate 31 and gives the flexibility to the display device 35. The flexible substrate 37 is attached On the display device with the acrylic adhesive including chloroform. A plastic or a metal foil is used as the flexible substrate 37.

The above-mentioned configuration material of the smoothing layer is mixed with a configuration material of adhesive attaching the flexible substrate 37, so that an overcoat layer, which simultaneously performs a function of the smoothing layer and a function of the adhesive, may be formed.

Figure 3D:
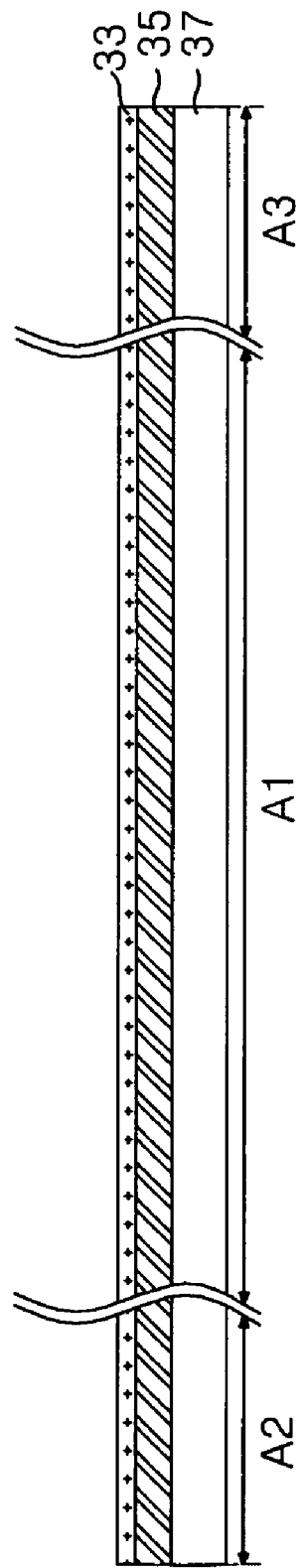

As shown in FIG. 3D, in the step of removing the glass substrate 31, the glass substrate 31 is etched or polished. In this case, the etching process includes a wet-etching process and a dry-etching process. An etching solution used during the wet-etching process includes the buttered hydrogen fluoride HF+NH4F (hereinafter, referred to as "BHF"). An etching gas used during the dry-etching process includes the CF4+O2 or SF6+O2. In a polishing process, the glass substrate 31 is removed using a grinder such as alumina. It is difficult to uniformly carry out the polishing process in the case where an area of the glass substrate to be removed is wide. Thus, it is desirable that the polishing process is applied to a manufacture of a small-sized display device. An etching time of the step of removing the glass substrate 31 (S7) is set to etch the glass substrate 31 and not to remove the insulating protective layer 33 in consideration of an etching selectivity on the glass of the insulating protective layer 33. The insulating protective layer 33 is not removed and protects the display device 35 from the exterior environment.

As shown in FIG. 3D, after removing the glass substrate 31, the structure is turned over in order that the flexible substrate 37 is located at a lower part. In this case, the display device 35 is being protected by the insulating protective layer 33. Also, the electrodes, which are formed at the pad areas A2 and A3, should be exposed. This is caused by a fact that the pad areas A2 and A3 should be connected to a Tape Carrier Package (hereinafter, referred to as "TCP") where an integrated circuit such as a gate drive integrated circuit and a data drive integrated circuit and the like is mounted in the later driving circuit mounting process in order to supply a driving signal to the thin film transistor.

The step of opening pad part (S9) exposes the pad electrodes which are formed at the pad areas A2 and A3. Electrodes of the pad areas A2 and A3, which are exposed in the step of opening the pad part (S9), are connected to the TCP. Such a TCP is attached to the electrodes of the pad areas A2 and A3, which are primarily exposed by a Tape Automated Bonding (hereinafter, referred to as "TAB"), to be connected to the electrodes of the pad areas A2 and A3. In this case, it is desirable that the exposed electrodes of the pad areas A2 and A3 is formed of a transparent oxidized conductive layer that includes Tin Oxide TO, Indium Tin Oxide ITO, Indium Zinc Oxide IZO, and Indium Tin Zinc Oxide ITZO.

Hereinafter, a reason why the exposed electrodes of the pad areas A2 and A3 is formed of the transparent oxidized conductive layer will be described as follows. In order to expose the electrodes of the pad areas A2 and A3, the step of opening the pad part (S9) may include a process of dry-etching the insulating protective layer 33. In this case, the etching gas includes oxygen $O_2$. Also, the exposed electrodes of the pad areas A2 and A3 are exposed to oxygen $O_2$ of atmosphere. Oxygen $O_2$ oxidizes a general metal such as Al, Mo, and Cr and the like to form an oxide at a surface of the metal, thereby deteriorating conductivity of the metal. On the other hand, although the transparent oxidized conductive layer is in contact with oxygen $O_2$, the transparent oxidized conductive layer has an excellent conductivity in comparison with the case where a general metal such as Al, Mo, and Cr and the like is oxidized. As a result, the transparent oxidized conductive layer can improve reliability of the display device. Also, since the transparent oxidized conductive layer has an excellent adhesive force with the TCP in comparison with a general metal such as Al, Mo, and Cr and the like, the transparent oxidized conductive layer can improve stability of a process. Accordingly, it is desirable that the exposed electrode of the pad areas A2 and A3 are formed of the transparent oxidized conductive layer.

Figure 3E:
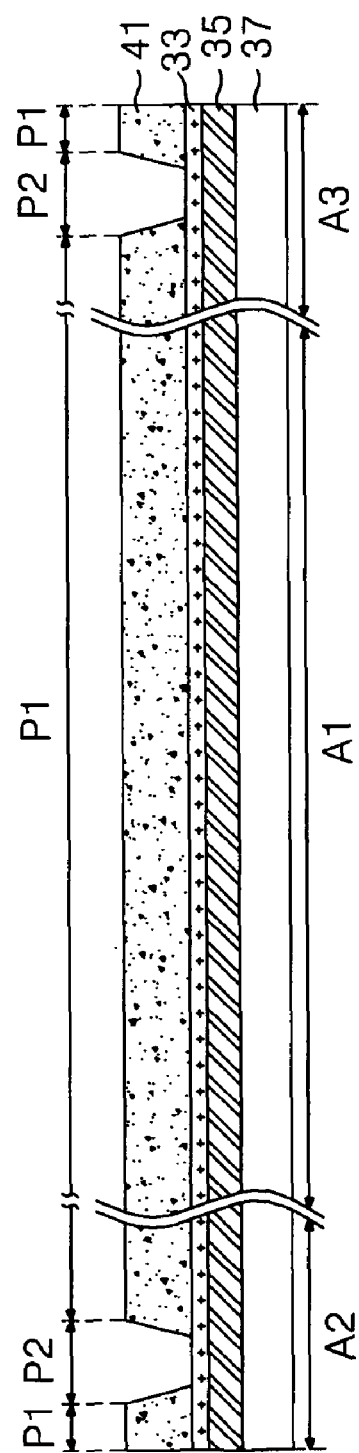
Figure 3F:
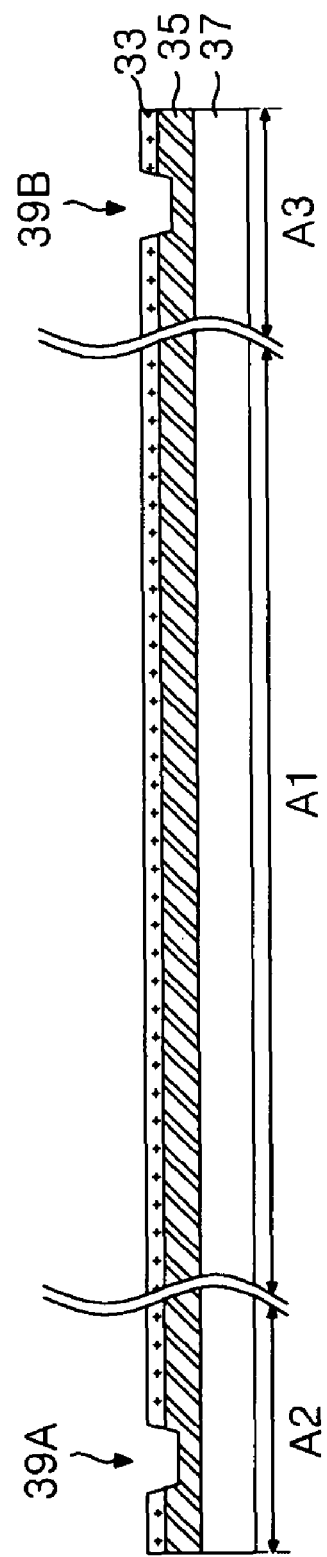

The above-mentioned specific process of the step of opening the pad part is largely classified into two methods depending upon a process in the step of forming the display device 35 and a structure of the thin film patterns included in the display device 35. One method forms pad holes 39A and 39B through a photolithography process and an etching process as shown in FIG. 3E and FIG. 3F. The other method entirely etches the insulating protective layer 33 as shown in FIG. 4.

A process of forming the pad holes 39a and 39b can be applied in the case where one or more insulating films are formed on an electrode of the pad part to be exposed. Also, the process of forming the pad holes 39A and 39B can also be applied in the case where the electrode of the pad part to be exposed is a transparent conductive layer and a general metal such as Al, Mo, and Cr and the like is further formed on the transparent conductive layer to be exposed. As shown in FIG. 3E, in the process of forming the pad holes 39A and 39B, a photo-resist pattern 41 forming the pad holes 39A and 39B is formed on the insulating protective layer 33. Herein, the photo-resist pattern 41 forming the pad holes 39A and 39B is formed by exposing and developing a photo-resist material, which is formed on the insulating protective layer 33, using a mask including a cut-off area and an aperture area. Such a photo-resist pattern 41 includes a shielding part P1 where the photo-resist material is left after developing a photo-resist material, and an aperture part P2 that exposes the insulating protective layer 33 by removing the photo-resist pattern after developing a photo-resist material. The photo-resist pattern 41 forming the pad holes 39A and 39B can be formed by a printing method other than the exposing and developing processes using a mask. Herein, the printing method sprays the photo-resist material into only an area corresponding to the shielding part P1 using an ink jet to form the photo-resist pattern 41. In this case, the aperture part P2 exposing the insulating protective layer 33 is formed at an area where the photo-resist material is not sprayed. An insulating film that includes the insulating protective layer 33 corresponding to the aperture part P2, or a general metal such as Al, Mo, and Cr and the like is etched to form the pad holes 39A and 39B as shown in FIG. 3F. In general, the metal layer is wet-etched, and the etching solution, which is used for the wet-etching process etching the metal layer, can corrode the transparent oxidized conductive layer of the pad areas A2 and A3. Accordingly, it is desirable that a conductive layer most adjacent to the insulating protective layer 33 is made to be the transparent oxidized conductive layer in an area where the pad holes 39A and 39B. In other words, it is desirable that a conductive layer, which is formed on an uppermost layer of the pad part upon carrying out of the step of opening the pad part (S9), is the transparent oxidized conductive layer in order to carry out an etching process exposing the transparent oxidized conductive layer more stably.

Furthermore, a process of entirely etching the insulating protective layer 33 is applied in the case where conductive layers, which are directly in contact with the insulating protective layer 33, are all transparent oxidized conductive layers. Also, it is possible for a process of forming the pad holes 39A and 39B to be applied to this case. However, the process of entirely etching the insulating protective layer 33 does not include the photolithography process to more simplify an entire process.

The insulating protective layer 33 can be wet-etched or dry-etched. For example, the insulating protective layer 33, which is formed of the silicon oxide, the silicon nitride, the silicon film, and an organic insulating film, is dry-etched by an etching gas including $CF_4+O_2$ or $SF_6+O_2$ and the like. The insulating protective layer 33, which is formed of the metal oxide, is dry-etched by an etching gas including Cl, or is wet-etched by the etching solution. In this case, an etching time of the insulating protective layer 33 can be set to have a time longer than an etching time of the glass substrate.

Hereinafter, the flexible display device and the fabricating method thereof according to the embodiments of the present invention will be specifically described with reference to FIG. 5A to FIG. 9C. Specially, the flexible display device in the case where the conductive layer, which is formed on an uppermost layer of the pad part, is made to be the transparent oxidized conductive layer, and the fabricating method thereof will be described in FIG. 5A to FIG. 9C.

Figure 5A:
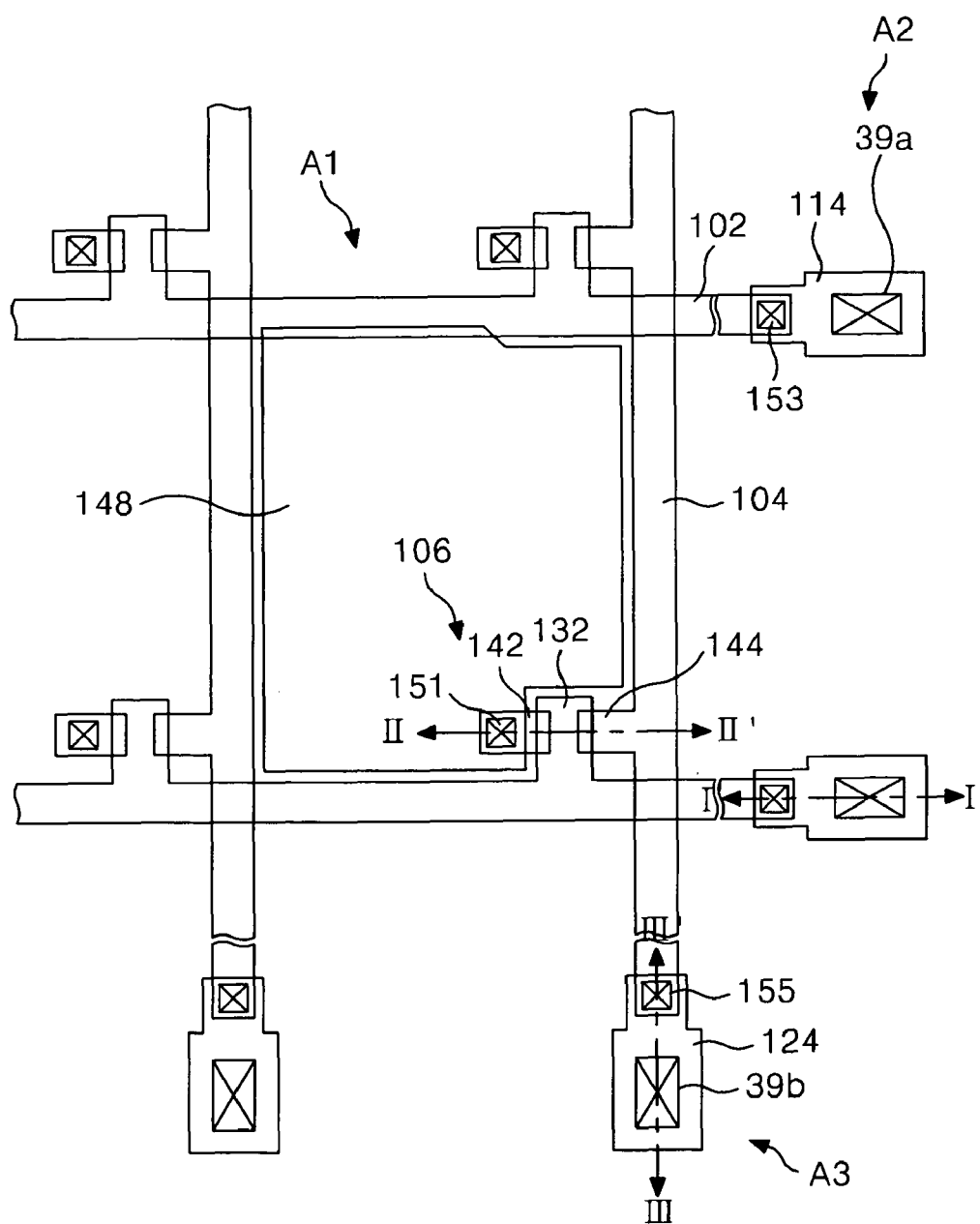
FIG. 5A and FIG. 5B are a plan view and a sectional view for specifically explaining a flexible display device according to a first embodiment of the present invention.
Figure 5B:
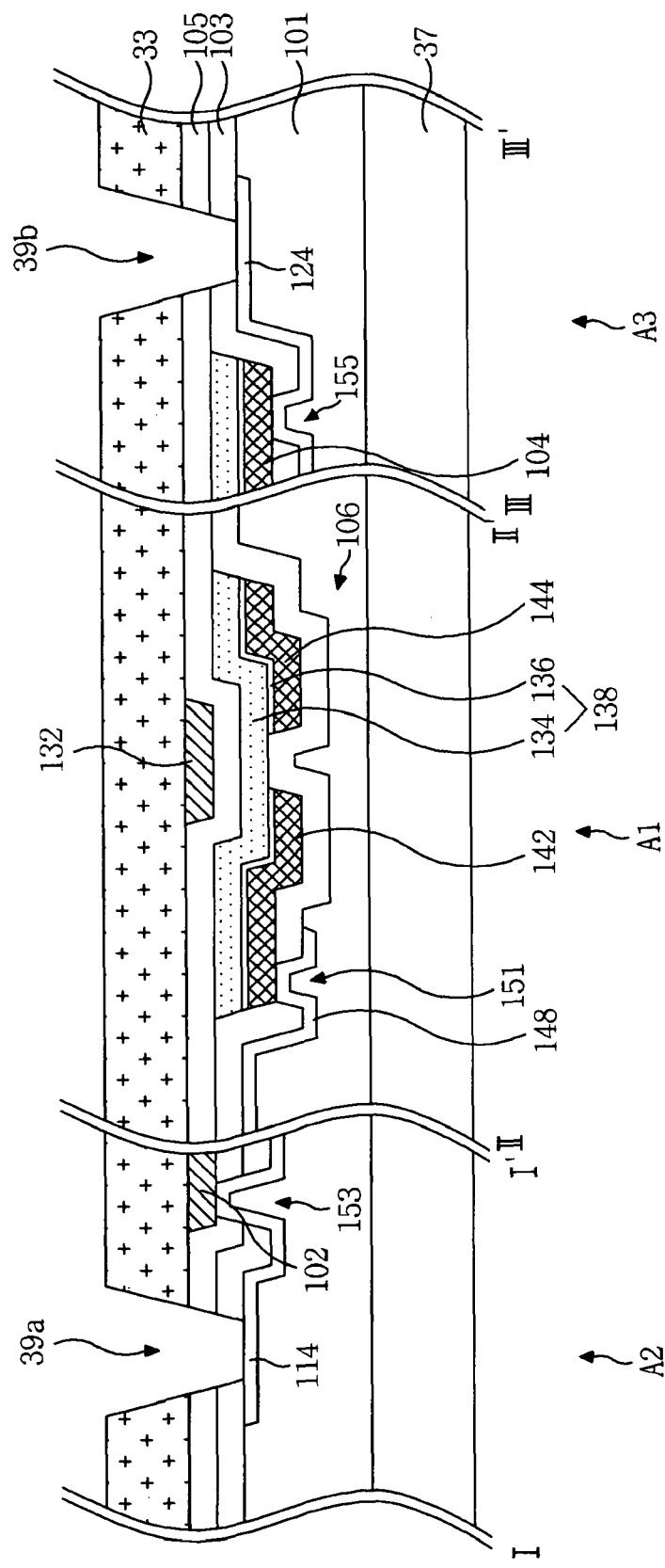

FIG. 5A and FIG. 5B are a plan view and a sectional view for specifically explaining a flexible display device according to a first embodiment of the present invention.

Referring to FIG. 5A and FIG. 5B, the flexible display device according to the first embodiment of the present invention includes a plurality of unit pixels, the gate pad part A2, and the data pad part A3. Herein, the plurality of unit pixels are formed at the pixel array area A1. The gate pad part A2 is formed at an exterior of the pixel array area A1 to supply scanning signals to the unit pixels. The data pad part A3 supplies video signals to the unit pixels.

The gate pad part A2 and the data pad part A3 according to the first embodiment of the present invention include a gate pad electrode 114 and a data pad electrode 124 of a single layer structure which are formed of the transparent oxidized conductive layer. Also, in the gate pad part A2 and the data pad part A3 according to the first embodiment of the present invention, thin films 103 and 105, which are formed of an inorganic insulating material and an organic insulating material, are formed between the insulating protective layer 33 and the pad electrodes 114 and 124. Accordingly, the pad holes 39a and 39b passing through the insulating protective layer 33 and the thin films 103 and 105 are formed in order to expose the pad electrodes 114 and 124 to the gate pad part A2 and the data pad part A3 according to the first embodiment of the present invention.

The unit pixels are defined by a gate line 102 and a data line 104 which are crossed to be insulated with each other. A thin film transistor 106 array and a pixel electrode 148 are formed at each of the unit pixels. Herein, the thin film transistor 106 array is connected to the gate line 102 and the data line 104. The pixel electrode 148 is connected to the thin film transistor 106.

The thin film transistor 106 allows a video signal applied to the data line 104 to be charged into the pixel electrode 148 and kept in response to a scan signal applied to the gate line 102. To this end, the thin film transistor 106 includes a gate electrode 132, which is extended from the gate line 102, a source electrode 144, which is extended from the data line 104, and a drain electrode 142 which is connected to the pixel electrode 148. Herein, the drain electrode 142 is connected, via a pixel contact hole 151, which passes through the protective film 103, to the pixel electrode 148. Also, the thin film transistor 106 includes a semiconductor pattern 138 having an active layer 134 and an ohmic contact layer 136. The active layer 134 is overlapped with the gate electrode 132 with having the gate insulating film 105 therebetween to form a channel between the source electrode 144 and the drain electrode 142. The ohmic contact layer 136 is formed between the active layer 134 and the source electrode 144, and between the active layer 134 and the drain electrode 142 to allow the active layer 134 to make an ohmic contact with the source electrode 144 and the drain electrode 142.

The gate line 102 and the data line 104 are provided such that a metal such as Mo, Ti, Cu, AlNd, Al, Cr, Mo-alloy, Cu-alloy, Al-alloy and the like is disposed in a single layer structure or a multiple layered structure. Such a gate line 102 receives scanning signals from the gate pad part A2, and the data line 104 receives video signals from the data pad part A3. To this end, the gate pad electrode 114 of the gate pad part A2 should be connected to the gate line 102, and the data pad electrode 124 of the data pad part A3 should be connected to the data line 104. The gate pad electrode 114, which is formed in a single layer structure of the transparent oxidized conductive layer, is extended toward the gate line 102 direction to pass through the protective film 103 and the gate insulating film 105, thereby being connected, via the gate contact hole 153, which exposes one side end of the gate line 102, to the gate line 102. Also, the data pad electrode 124, which is formed in a single layer structure of the transparent oxidized conductive layer, is extended toward the data line 104 direction to pass through the protective film 103, thereby being connected, via the data contact hole 155, which exposes one side end of the data line 104, to the data line 104.

The above-mentioned insulating protective layer 33 and the display device including the unit pixels and the pad part are formed on the flexible substrate 37 with having an overcoat layer 101 therebetween.

In the flexible display device according to the first embodiment of the present invention shown in FIG. 5A and FIG. 5B, the gate pad electrode 114 and the data pad electrode 124 are formed of only transparent oxidized conductive layer, and the transparent oxidized conductive layer is exposed by the pad contact holes 39a and 39b to be connected to the TCP. Also, the gate pad electrode 114 and the data pad electrode 124 are connected to the gate line 102 and the data line 104 in a part where is not overlapped with the pad contact holes 39a and 39b. Thus, a process of removing a separate metal layer is not required in order to expose the gate pad electrode 114 and the data pad electrode 124. Furthermore, the insulating protective layer 33, the gate insulating film 105, and the protective film 103 can be etched by the same etching equipment in the case where the insulating protective layer 33 is formed of the silicon nitride, the silicon oxide, the silicon film, and the organic insulating film. This is caused by a fact that the gate insulating film 105 and the protective film 103 are formed of the inorganic insulating material or the organic insulating material, and the inorganic insulating material or the organic insulating material are dry-etched by the etching gas including $CF_4+O_2$ or $SF_6+O_2$ similar to an etching of the insulating protective layer 33.

FIG. 6A to FIG. 6D are sectional views for explaining a step of forming the flexible display device shown in FIG. 5A and FIG. 5B. The step of forming the display device is carried out after the insulating protective layer 33 is formed on the thick glass substrate 31 as described in FIG. 2 and FIG. 3A. Referring to FIG. 6A to FIG. 6D, the flexible display device according to the first embodiment of the present invention is formed by a plurality of mask processes including the photolithography process and the etching process.

As shown in FIG. 6A, the gate conductive layer is patterned by a first mask process to form a gate conductive pattern including the gate line 102 and the gate electrode 132 on the insulating protective layer 33. Herein, the gate conductive layer is formed of a metal such as Mo, Ti, Cu, AlNd, Al, Cr, Mo-alloy, Cu-alloy, Al-alloy and the like in a single layer structure or a multiple layered structure.

Next, as shown in FIG. 6B, the gate insulating film 105 is formed on the insulating protective layer 33 provided with the gate conductive pattern. The semiconductor pattern 138, and a source/drain pattern that has the data line 104, the source electrode 144, and the drain electrode 142, are formed on the gate insulating film 105 by a second mask process. Since the second mask process is carried out by a diffractive exposure mask or a half transmitting mask, the semiconductor pattern 138 and the source/drain pattern can be formed by one mask process. Herein, the inorganic insulating material such as SiOx, SiNx and the like is used as the gate insulating film 105. An amorphous silicon is used as the active layer 134. An amorphous silicon doped with an impurity (n+ or p+) is used as the ohmic contact layer 136. The source/drain pattern is provided such that a metal such as Mo, Ti, Cu, AlNd, Al, Cr, Mo-alloy, Cu-alloy, Al-alloy and the like is disposed in a single layer structure or a multiple layered structure.

Next, as shown in FIG. 6C, the protective film 103 including contact holes 151, 153, and 155 is formed on the semiconductor pattern 138 including the channel, and the gate insulating film 105 provided with the source/drain pattern by a third mask process. The protective film 103 is formed of the inorganic insulating material identical to the gate insulating film 105, or an organic insulating material such as an acrylic organic compound having a small dielectric constant, BCB or PFCB and the like.

As shown in FIG. 6D, the pixel electrode 148, the gate pad electrode 114, and a transparent conductive pattern of the data pad electrode 124 are formed on the protective film 103 by a fourth mask process. Herein, the transparent conductive pattern is formed of a transparent oxidized conductive metal including TO, ITO, IZO, and ITZO and the like.

Next, a smoothing layer that levels a surface where the display device is provided, can be further formed at a surface of the protective film 103. Also, the over-coat layer 101 further including a smoothing layer forming material and adhesives, instead of the smoothing layer can be formed at the surface of the protective film 103.

After the process of fabricating the display device is over, the flexible substrate 37 is attached, the glass substrate is removed, and then the flexible substrate 37 is located at the lower part as described in FIG. 2, FIG. 3C to FIG. 3F. Next, the gate pad hole 39a and the data pad hole 39b are formed. Herein, the gate pad hole 39a and the data pad hole 39b are formed by removing the insulating protective layer 33, which is overlapped with the gate pad electrode 114 and the data pad electrode 124, the gate insulating film 105, and the protective film 103 with the etching process.

Figure 7A:
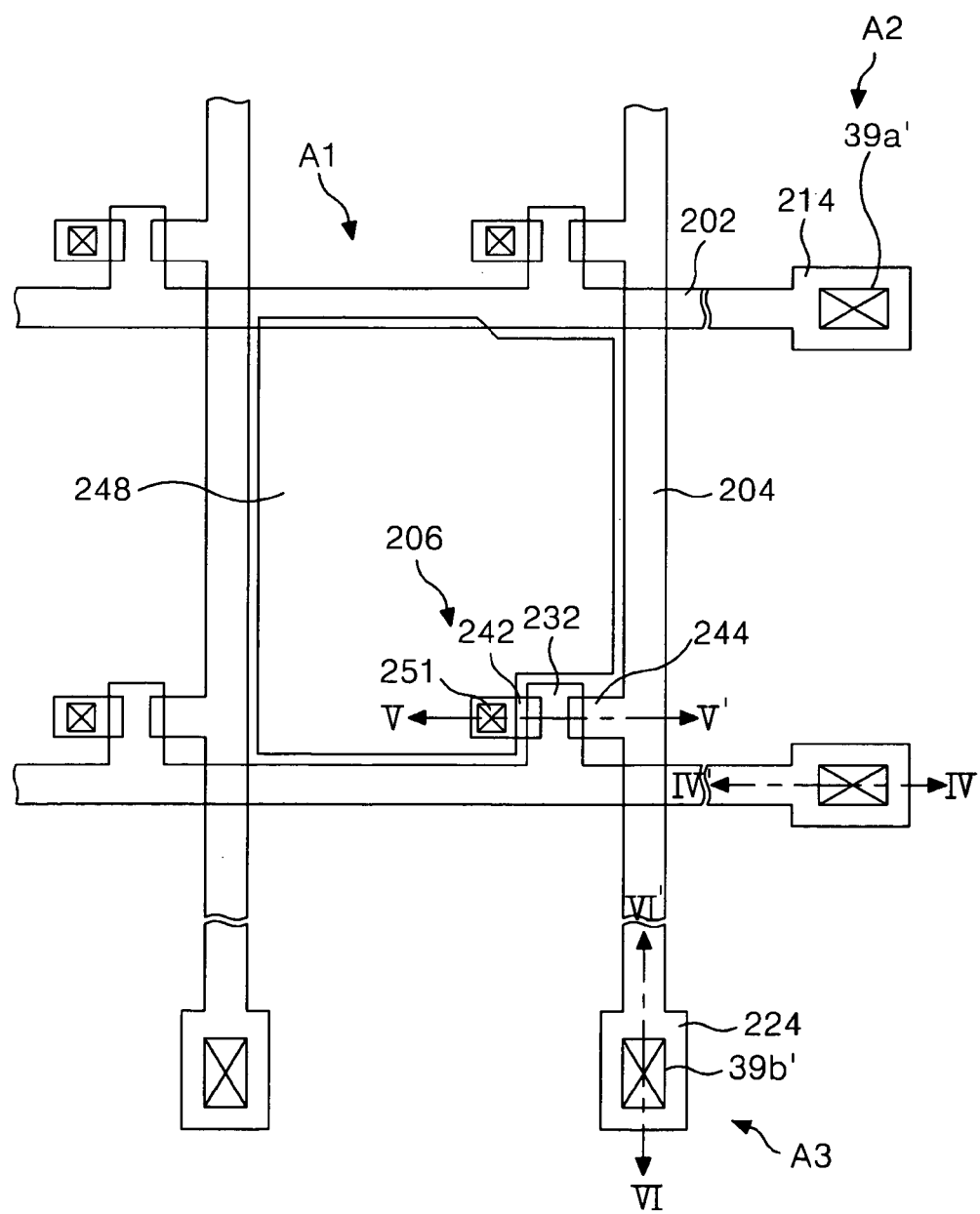
FIG. 7A and FIG. 7B are a plan view and a sectional view for specifically explaining a flexible display device according to a second embodiment of the present invention.
Figure 7B:
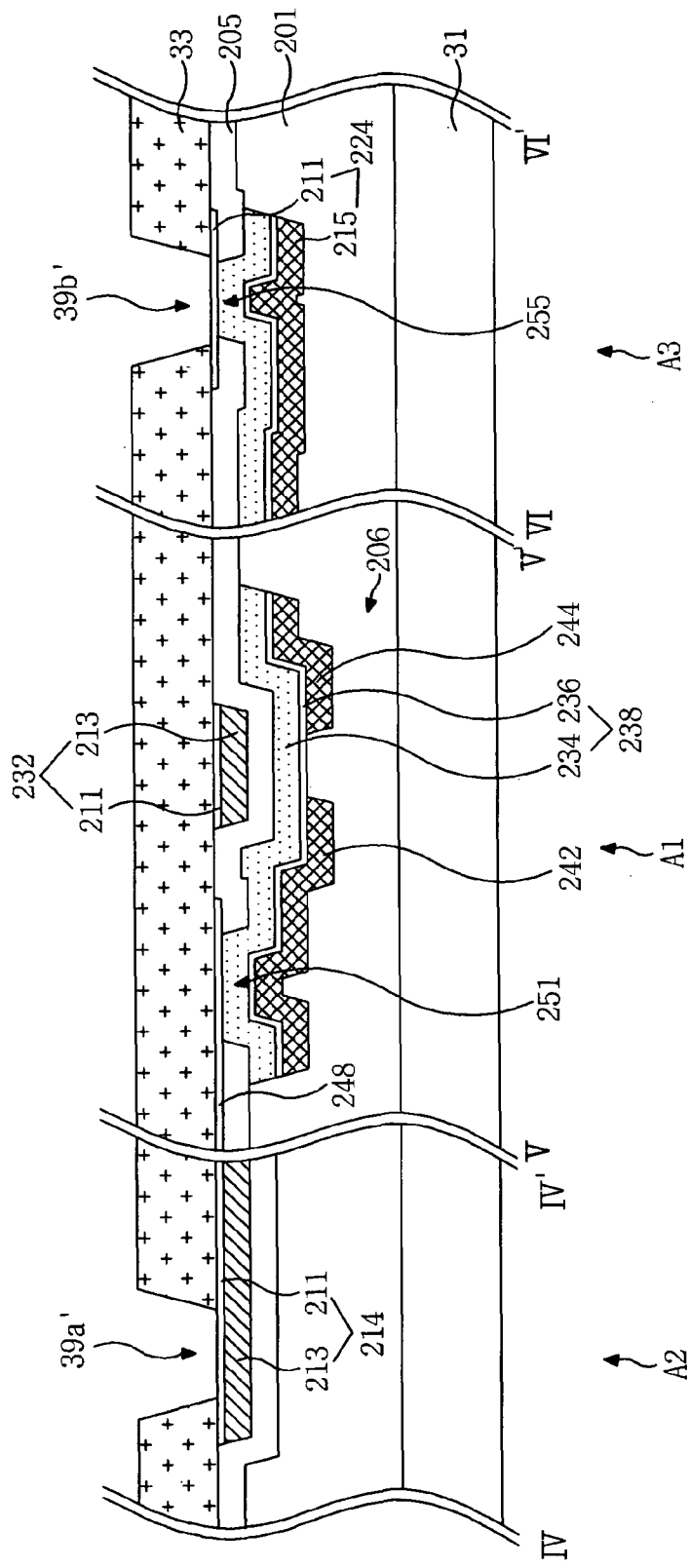

FIG. 7A and FIG. 7B are a plan view and a sectional view for explaining a flexible display device according to a second embodiment of the present invention.

Referring to FIG. 7A and FIG. 7B, the flexible display device according to the second embodiment of the present invention includes the plurality of unit pixels, the gate pad part A2, and the data pad part A3 like FIG. 5A and FIG. 5B. Herein, the plurality of unit pixels are formed at the pixel array area A1. The gate pad part A2 is formed at an exterior of the pixel array area A1 to supply scanning signals to the unit pixels. The data pad part A3 supplies video signals to the unit pixels. Hereinafter, a part, which is different from the embodiments shown in FIG. 5A and FIG. 5B, will be specifically described, and the repeated description will be omitted.

A gate pad electrode 214 and a data pad electrode 224 of the flexible display device according to the second embodiment of the present invention are formed in a multiple layered structure including a transparent oxidized conductive layer 211. In this case, the transparent oxidized conductive layer 211, which is included in the pad electrodes 214 and 224, is directly in contact with the insulating protective layer 33 so as to be exposed without a process of etching a metal. The transparent oxidized conductive layer 211, which is included in the pad electrodes 214 and 224, according to another embodiment of the present invention is exposed via pad holes 39a' and 39b' passing though the insulating protective layer 33.

A thin film transistor 206 according to the second embodiment of the present invention includes a gate electrode 232, which is extended from the gate line 202, a source electrode 244, which is extended from the data line 204, and a drain electrode 242 which is connected to the pixel electrode 248. The pixel electrode 248 according to the second embodiment of the present invention is formed of the transparent oxidized conductive layer to be directly in contact with the insulating protective layer 33. A gate insulating film 205 is formed between the pixel electrode 248 and the drain electrode 242. Accordingly, the drain electrode 242 according to the second embodiment of the present invention passes through the gate insulating film 205 to be connected, via a pixel contact hole 251 exposing the pixel electrode 248, to the pixel electrode 248. Also, the thin film transistor 206 according to the second embodiment of the present invention includes a semiconductor pattern 238 having an active layer 234 and an ohmic contact layer 236. The active layer 234 is overlapped with the gate electrode 232 with having the gate insulating film 205 therebetween to form a channel between the source electrode 244 and the drain electrode 242. The ohmic contact layer 236 is formed between the active layer 234 and the source electrode 244, and between the active layer 234 and the drain electrode 242 to allow the active layer 234 to make an ohmic contact with the source electrode 244 and the drain electrode 242. Accordingly, the pixel electrode 248 is connected to the drain electrode 242 by contacting the semiconductor pattern 238, which is connected to the drain electrode 242, with the pixel electrode 248 via the pixel contact hole 251.

The gate line 202 according to the second embodiment of the present invention is comprised of the transparent oxidized conductive layer 211, which is directly contact with the insulating protective layer 33, and the gate conductive layer 213 which is disposed on the transparent oxidized conductive layer 211. Herein, the gate conductive layer 213 is provided such that an opaque metal such as Mo, Ti, Cu, AlNd, Al, Cr, Mo-alloy, Cu-alloy, Al-alloy and the like is disposed in a single layer structure or a multiple layered structure. Such a gate line 202 receives scanning signals from the gate pad part A2.

The gate pad part A2 should be connected to the gate line 202 in order to supply scanning signals to the gate line 202. To this end, the gate pad part A2 is comprised of the gate pad electrode 214 which is extended from the gate line 202.

The data line 204 according to the second embodiment of the present invention is comprised of a source/drain conductive layer 215 provided such that an opaque metal such as Mo, Ti, Cu, AlNd, Al, Cr, Mo-alloy, Cu-alloy, Al-alloy and the like is disposed in a single layer structure or a multiple layered structure. The semiconductor pattern 238 is overlapped between the data line 204 and the gate insulating film 205. Such a data line 204 receives video signals from the data pad part A3.

The data pad part A3 should be connected to the data line 204 in order to supply video signals to the data line 204. To this end, the data pad part A3 includes the transparent oxidized conductive layer 211, a data contact hole 255, and the source/drain conductive layer 215. Herein, the data contact hole 255 passes through the gate insulating film 205 to expose the transparent oxidized conductive layer 211 of the data pad part A3. The source/drain conductive layer 215 is extended from the data line 204 to be connected, via the data contact hole 255, to the transparent oxidized conductive layer 211 of the data pad part A3. The semiconductor pattern 238 is overlapped between the transparent oxidized conductive layer 211 of the data pad part A3 and the source/drain conductive layer 215.

The display device having the above-mentioned unit pixels and the pad parts further includes a smoothing layer and an adhesive layer (not shown), or an over-coat layer 201. Herein, the smoothing layer and the over-coat layer 201 are formed at a bordering surface of the conductive layers of the display device and the flexible substrate 37. Such a smoothing layer or the over-coat layer 201 levels a surface where the display device is formed and protects the display device. Thus, a separate protective film may be not formed between the smoothing layer and the display device, or between the over-coat layer 201 and the display device.

Figure 8A:
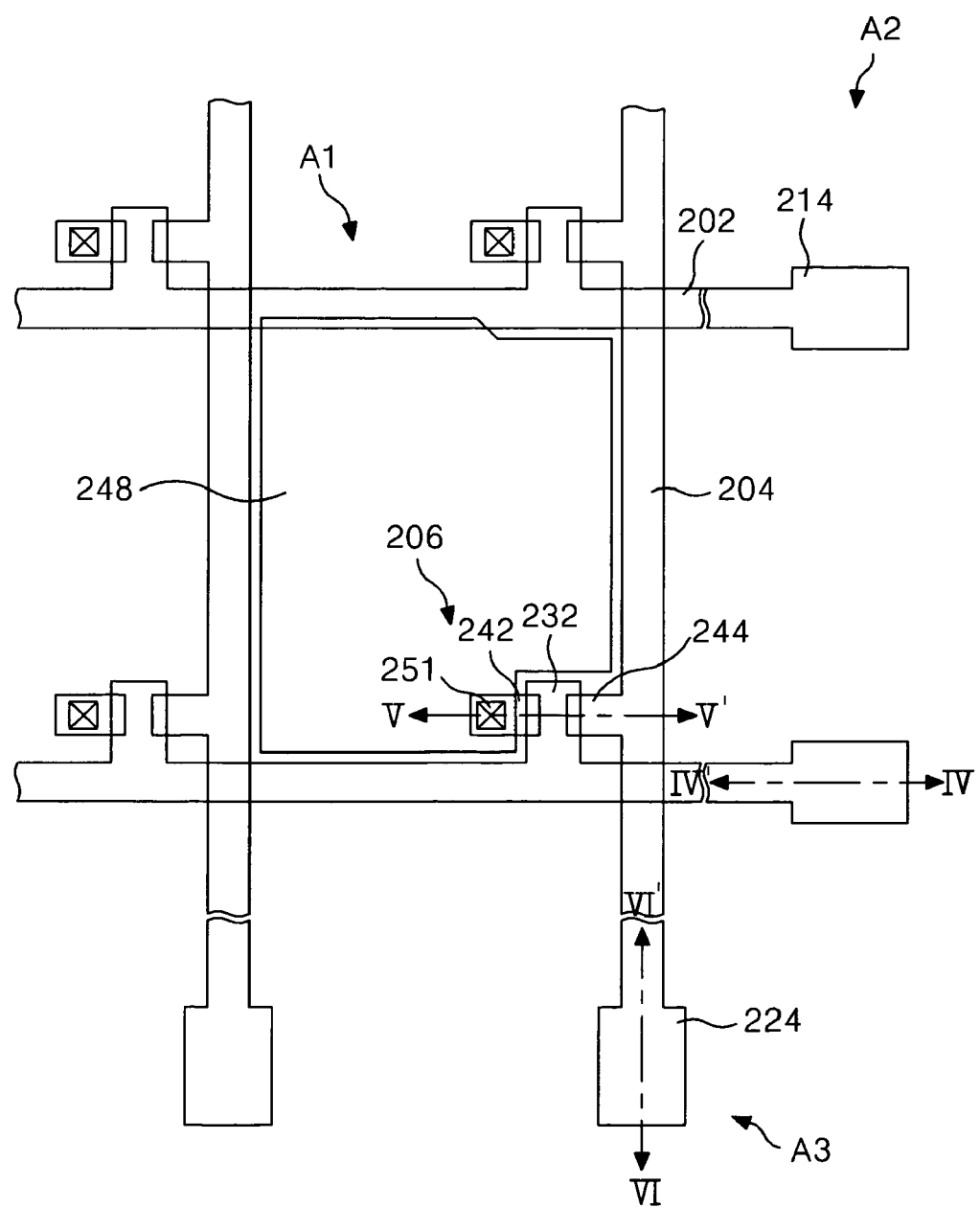
FIG. 8A and FIG. 8B are a plan view and a sectional view for specifically explaining a flexible display device according to a third embodiment of the present invention.
Figure 8B:
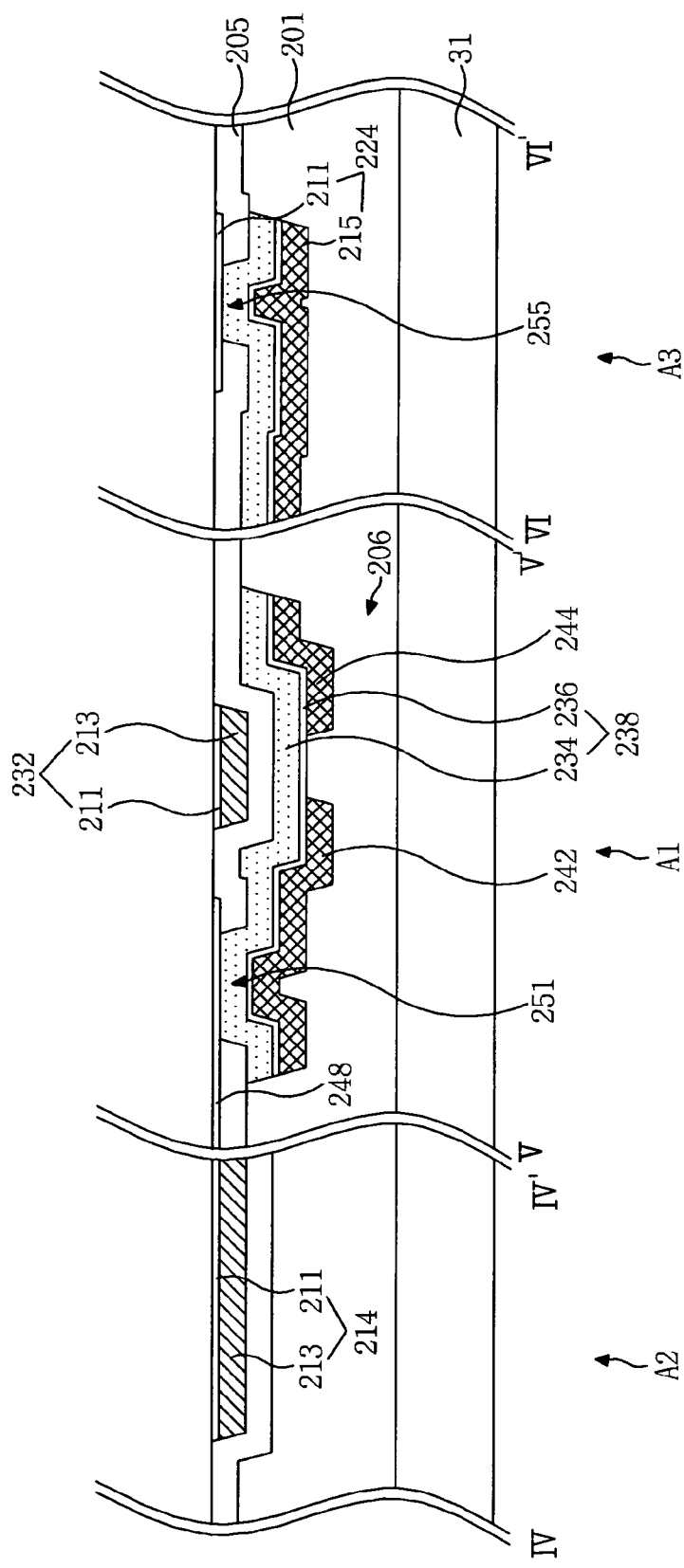

FIG. 8A and FIG. 8B are a plan view and a sectional view for explaining a flexible display device according to a third embodiment of the present invention.

Referring to FIG. 8A and FIG. 8B, the flexible display device according to the third embodiment of the present invention has the same structure as the second embodiment of the present invention shown in FIG. 7A and FIG. 7B except that the insulating protective layer 33 is removed. The step of opening the pad part exposing the pad electrodes 214 and 224 entirely etches the insulting protective layer 33 in the case where an uppermost conductive layer of the pad electrodes 214 and 224 is the transparent oxidized conductive layer 211 as shown in FIG. 8A and FIG. 8B. Accordingly, the flexible display device according to the third embodiment of the present invention is a structure that is adaptive for removing the photolithography process in order to open the pad part. As a result, the flexible display device according to the third embodiment of the present invention can be manufactured by a more simplified process compared to the second embodiment of the present invention.

Figure 9B:
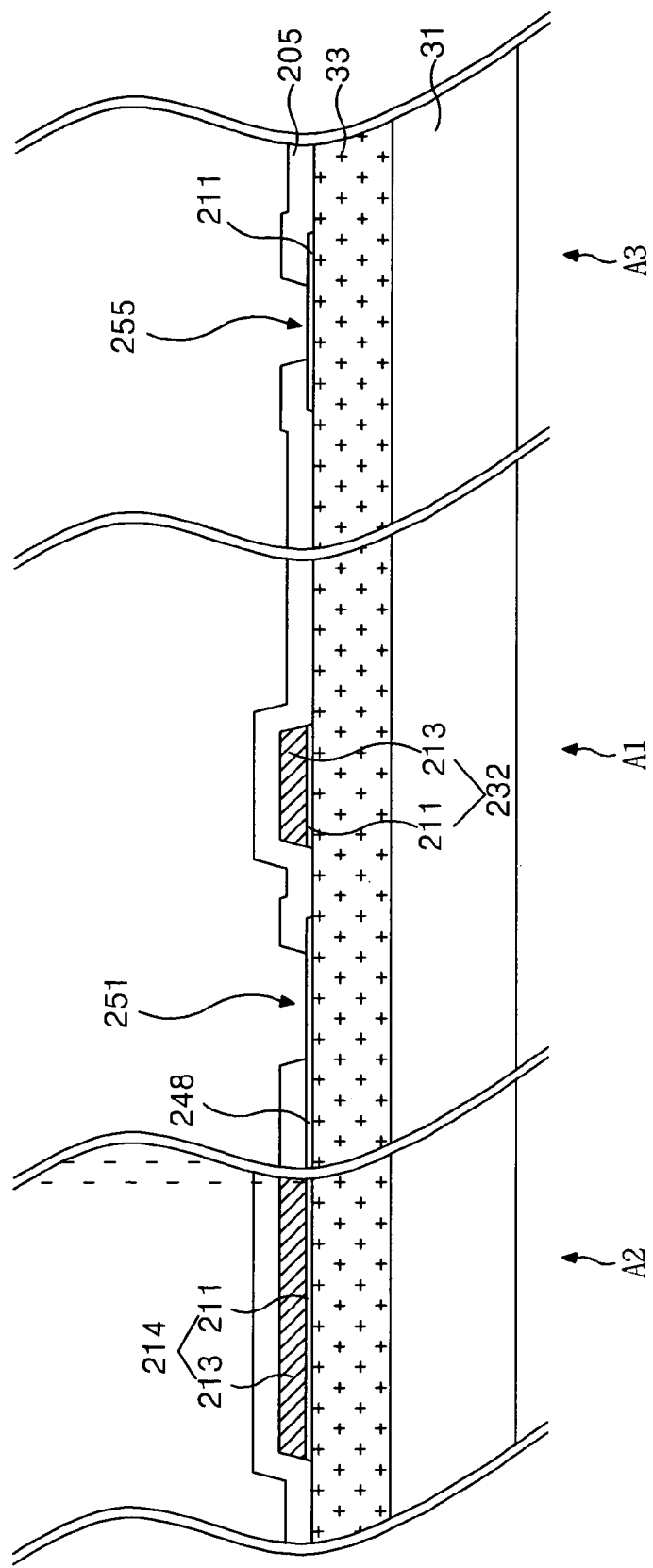

FIG. 9A to FIG. 9C are sectional views for explaining a step of forming a display device of the method of fabricating the flexible display device shown in FIG. 7A and FIG. 8B. As described in FIG. 2 and FIG. 3A, the step of forming the display device is carried out after the insulating protective layer 33 is formed on the thick glass substrate 31. Referring to FIG. 9A to FIG. 9C, the flexible display device according to the second and third embodiments of the present invention is formed by a plurality of mask processes including the photolithography process and the etching process.

As shown in FIG. 9A, the transparent oxidized conductive layer 211 and the gate conductive layer 213, which are sequentially disposed on the insulating protective layer 33, are patterned by the first mask process to form a transparent conductive pattern and a gate conductive pattern. The transparent conductive pattern is the pixel electrode 248, the data pad electrode 224, the gate line 202, the gate electrode 232, and the transparent oxidized conductive layer 211 of the gate pad electrode 214. The gate conductive pattern is the gate line 202, the gate electrode 232, and the gate conductive layer 213 which is disposed on the transparent oxidized conductive layer 211 of the gate pad electrode 214. Since any one of the diffractive exposure mask and the half transmitting mask is used as the first mask, the transparent conductive pattern and the gate conductive pattern are formed by one mask process. Herein, the gate conductive layer 213 is provided such that a metal such as Mo, Ti, Cu, AlNd, Al, Cr, Mo-alloy, Cu-alloy, Al-alloy and the like is disposed in a single layer structure or a multiple layered structure. The transparent oxidized conductive layer 211 is formed of a transparent oxidized conductive metal including TO, ITO, IZO, and ITZO and the like.

Next, as shown in FIG. 9B, the gate insulating film 205 including the pixel contact hole 251 and the data contact hole 255 is formed on the insulating protective layer 33 provided with the transparent conductive pattern and the gate conductive pattern by the second mask process. Herein, the gate insulating film 205 is formed of the inorganic insulating material such as $SiO_x$, $SiN_x$ and the like.

Next, as shown in FIG. 9C, the semiconductor pattern 238 having a channel, and a source/drain pattern comprised of the source/drain conductive layer 215 are formed on the gate insulating film 205 by the third mask process. Herein, the source/drain pattern includes the data line 204, the source electrode 244, the drain electrode 242, and the data pad electrode 224. Since the third mask process is carried out by the diffractive exposure mask or the half transmitting mask, the semiconductor pattern 238 and the source/drain pattern can be formed by one mask process. Herein, an amorphous silicon is used as the active layer 234. An amorphous silicon doped with an impurity (n+ or p+) is used as the ohmic contact layer 236. The source/drain conductive layer 215 is provided such that a metal such as Mo, Ti, Cu, AlNd, Al, Cr, Mo-alloy, Cu-alloy, Al-alloy and the like is disposed in a single layer structure or a multiple layered structure.

Next, a smoothing layer (not shown) or the over-coat layer 201 can be further formed at a surface of the gate insulating film 205 provided with the semiconductor pattern 238 and the source/drain pattern in order to level a surface where the display device is formed, and to protect the semiconductor pattern 238 and the source/drain pattern.

After the process of fabricating the display device is over, the flexible substrate 37 is attached, the glass substrate is removed, and then the flexible substrate 37 is located at the lower part as described in FIG. 2, FIG. 3C to FIG. 3F. Next, the method of fabricating the flexible display device according to the second embodiment of the present invention includes the step of forming the gate pad hole 39a' and the data pad hole 39b'. Herein, the gate pad hole 39a' and the data pad hole 39b' are formed by removing the insulating protective layer 33, which is overlapped with the transparent conductive layer 211 of the gate pad electrode 214 and the data pad electrode 224, with the etching process. Also, the method of fabricating the flexible display device according to the third embodiment of the present invention can expose the transparent conductive layer 211 of the gate pad electrode 214 and the data pad electrode 224 by an entire etching process of the insulating protective layer 33 instead of a separate process of forming the pad holes 39a' and 39b'.

As described above, the flexible display and the fabricating method thereof according to the present invention attach the flexible substrate, and then remove the glass substrate. Thus, the flexible display and the fabricating method thereof according to the present invention do not require a process of attaching the temporary substrate that temporarily supports the display device upon removing of the glass substrate. Accordingly, the flexible display and the fabricating method thereof according to the present invention also do not require a stripping process of the temporary substrate. As a result, the flexible display and the fabricating method thereof according to the present invention can prevent reliability deterioration of the display device by an attachment and a strip of the temporary substrate to improve reliability of the display device.

Also, in the flexible display and the fabricating method thereof according to the present invention, since the pad electrodes of the pad parts are exposed, the display device can be connected, via the pad electrodes, to a driving circuit. Furthermore, although the exposed pad electrodes are exposed to oxygen, the exposed pad electrodes are formed of the transparent oxidized conductive layer having a strong conductivity to improve reliability of the flexible display device.

The present invention further includes the smoothing layer or the over-coat layer that levels a surface where the display device, which is attached to the flexible substrate, is formed to allow a pressure which is pressurized when the smoothing layer or the over-coat layer is attached to the flexible substrate to be uniformly distributed on a surface where the display device is formed, and to perform a buffer action. Thus, the present invention can prevent a characteristics of the display device from deteriorating by an adhesive process of the flexible substrate.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of fabricating a flexible display device comprising:

forming an insulating protective layer at one side of a glass substrate; forming a display device including a thin film transistor array and a pad part, which is connected to the thin film transistor array, on the insulating protective layer;

attaching a flexible substrate on the display device;

removing the glass substrate; and exposing a pad electrode, which is included in the pad part, after removing the glass substrate.

2. The method of fabricating the flexible display device according to claim 1, wherein a method of forming the display device includes:

forming a gate conductive pattern including a gate line, which is formed of a gate conductive layer, and a gate electrode, which is extended from the gate line, on the insulating protective layer;

forming a gate insulating mm to cover the gate conductive pattern;

forming a semiconductor pattern, which is overlapped with the gate electrode, and a source/drain conductive pattern including a source electrode and a drain electrode, which are disposed on the semiconductor pattern, and a data line, which is extended from the source electrode and crosses the gate line;

forming a protective mm to cover the semiconductor pattern and the source/drain conductive pattern;

forming a gate contact hole that passes through the protective film and the gate insulating to expose the gate line, and a data contact hole that passes through the protective film to expose the data line; and forming a transparent oxidized conductive layer of a gate pad electrode, which is connected, via the gate contact hole, to the gate line, and a transparent oxidized conductive layer of a data pad electrode, which is connected, via the data contact hole, to the data line.

3. The method of fabricating the flexible display device according to claim 2, includes:

forming a photo-resist pattern at an external surface of the insulating protective layer after removing the glass substrate; and etching the insulating protective layer, the gate insulating film, and the protective film using the photo-resist pattern to form a pad hole that exposes a transparent oxidized conductive layer of the pad electrode.

4. The method of fabricating the flexible display device according to claim 2, wherein the transparent oxidized conductive layer includes anyone among TO (Tin Oxide), ITO (Indium Tin Oxide), ITZO (Indium Tin Zinc Oxide), and IZO (Indium Zinc Oxide).

5. The method of fabricating the flexible display device according to claim 1, wherein the step of forming the display device includes:

forming a transparent conductive pattern including a transparent oxidized conductive layer, that is, a data pad electrode, a gate pad electrode, a gate line, which is extended from the gate pad electrode, and a gate electrode, which is extended from the gate line, on the insulating protective layer, and a gate conductive pattern which is disposed on a transparent oxidized conductive layer of the gate pad electrode, the gate line, and the gate electrode;

forming a gate insulating film to cover the transparent conductive pattern and the gate conductive pattern;

forming a data contact hole that exposes a transparent oxidized conductive layer of the data pad electrode; and forming a source/drain conductive pattern including a semiconductor pattern, which is overlapped with the gate electrode, a source electrode and a drain electrode, which are disposed on the semiconductor pattern, a data line, which is extended from the source electrode and crosses the gate line, and a source/drain metal layer of a data pad electrode which is extended from the data line to be connected, via the data contact hole, to a transparent oxidized conductive layer of the data pad electrode.

6. The method of fabricating the flexible display device according to claim 5, includes:

forming a photo-resist pattern at an external surface of the insulating protective layer after removing the glass substrate; and etching the insulating protective layer using the photo-resist pattern to form a pad hole that exposes a transparent oxidized conductive layer of the pad electrode.

7. The method of fabricating, the flexible display device according to claim 5, includes:

entirely etching the insulating protective layer to expose the transparent conductive pattern after removing the glass substrate.

8. The method of fabricating the flexible display device according to claim 1, wherein a pad electrode, which is included in the pad part, is formed in a single layer structure or in a multiple layered structure that includes a transparent oxidized conductive layer.

9. The method of fabricating the flexible display device according to claim 8, wherein a transparent oxidized conductive layer of the pad electrode is most adjacent to the insulating protective layer in the pad part.

10. The method of fabricating the flexible display device according to claim 8, wherein a pad electrode, which is exposed in the step of exposing a pad electrode included in the pad part, is the transparent oxidized conductive layer.

11. The method of fabricating the flexible display device according to claim 1, wherein the step of forming the display device includes:
   forming a smoothing layer that levels a surface where the display device is formed.

\* \* \* \* \*